US009215820B2

(12) United States Patent
Villa-Real

(10) Patent No.: US 9,215,820 B2
(45) Date of Patent: Dec. 15, 2015

(54) PRACTICAL MULTI-PURPOSE COLOR-CODED FLASH DRIVE ORGANIZER WITH COMPARTMENTALIZED SEPARATE MEMORY SECTORS FOR ENHANCED EFFICIENCY AND BETTER EFFECTIVE ANTI-CONFUSION PERFORMANCES IN GLOBAL PERSONAL, EDUCATIONAL, PROFESSIONAL, BUSINESS AND ORGANIZATIONAL WORKS

(76) Inventor: Antony-Euclid C. Villa-Real, Las Vegas, NV (US)

( * ) Notice: Subject to any disclaimer, the term of this patent is extended or adjusted under 35 U.S.C. 154(b) by 769 days.

(21) Appl. No.: 13/507,727

(22) Filed: Jul. 23, 2012

(65) Prior Publication Data

US 2013/0027868 A1 Jan. 31, 2013

Related U.S. Application Data

(60) Provisional application No. 61/574,041, filed on Jul. 27, 2011.

(51) Int. Cl.
*H05K 5/02* (2006.01)
*H01R 13/447* (2006.01)

(52) U.S. Cl.
CPC ............ *H05K 5/0278* (2013.01); *H01R 13/447* (2013.01)

(58) Field of Classification Search
CPC ....... G06F 1/187; G06F 1/184; G06F 1/1616; G06F 1/181; G06F 1/1626; H05K 5/0278; E05B 73/0082; H04M 1/0214; H04M 1/6066; H04M 1/0237; H01R 13/447
See application file for complete search history.

(56) References Cited

U.S. PATENT DOCUMENTS

| 8,214,545 | B2 * | 7/2012 | Khan et al. .................... 710/10 |
| 8,684,753 | B2 * | 4/2014 | Zhang et al. ................. 439/131 |
| 8,993,866 | B2 * | 3/2015 | Jobs et al. ...................... 84/615 |
| 2009/0171163 | A1 * | 7/2009 | Mates et al. .................. 600/300 |
| 2009/0211860 | A1 * | 8/2009 | Glenn ..................... 191/12.2 R |
| 2011/0072700 | A1 * | 3/2011 | Theresa et al. ................. 40/638 |

OTHER PUBLICATIONS

Office of Innovation Develpoment, Advanced Claim Drafting, Aug. 15-16 2014, USPTO, all pages.*

* cited by examiner

*Primary Examiner* — Michael Zarroli

(57) ABSTRACT

Multi-purpose anti-confusing, time-saving, cost-effective hybrid flash drive organizers, methods and systems with easily recognizable color-coded external sectors, color-coded differential LED signal lights, correlating respectively with related internal/external electronic components, achieving easier organized data/information sharing, transfer, storage, retrieval and display when connected to host system; one embodiment having attachable/detachable sectors providing different combinations of USB connectors; another embodiment of with uni-body housing having one common USB prong; another embodiment with at-least a pair of USB prongs; all offering faster conveniences to millions of global flash drive users in all walks of life, providing vast applicability for numerous personal, professional, educational, organizational and business works; providing to different manufacturers, distributors and merchandisers with greater range of practical applications and marketing advantages; broadly applicable to inter-link with desktop/laptop computers, netbooks, tablet PCs or other compatible portable hand-held or stationary electronic multi-media devices.

27 Claims, 40 Drawing Sheets

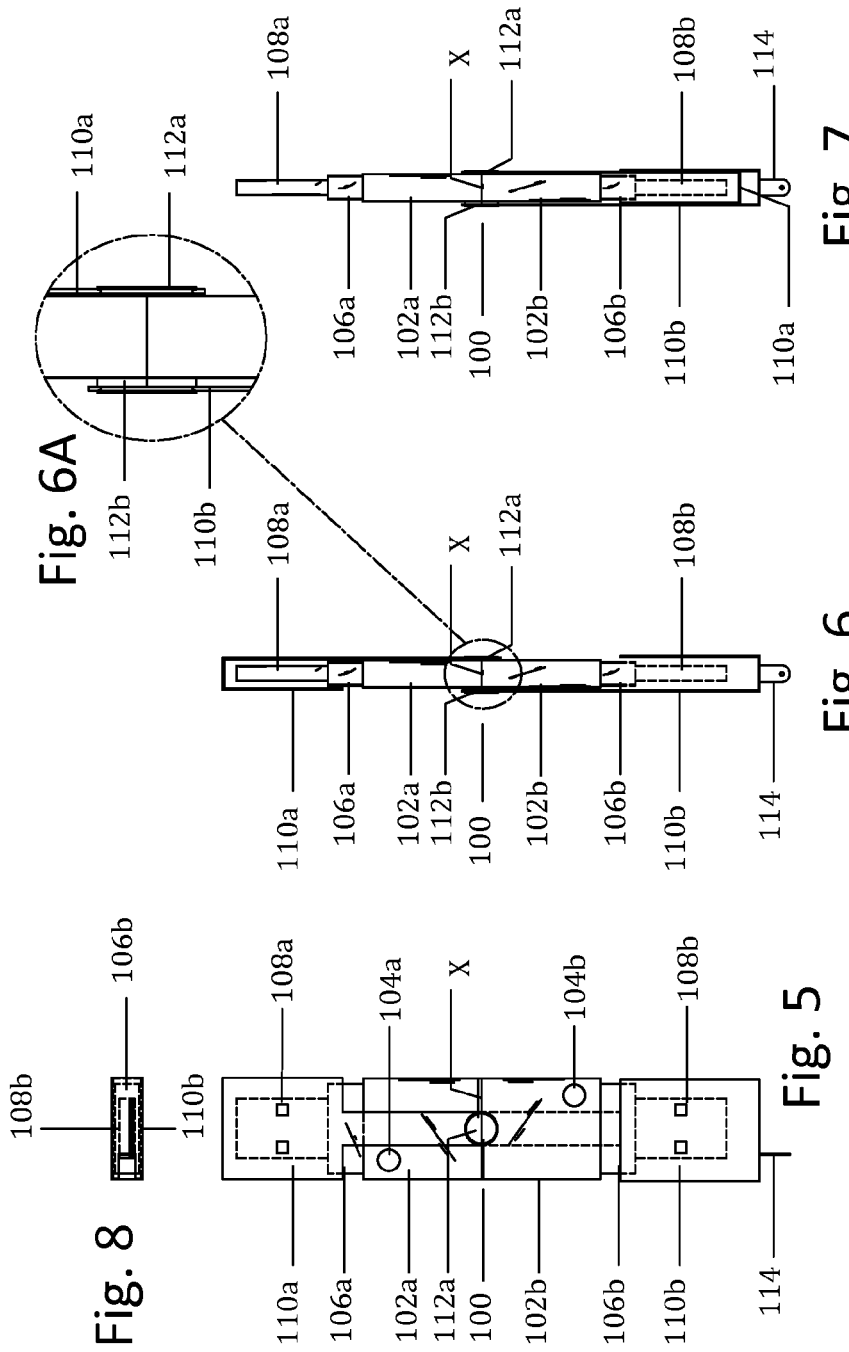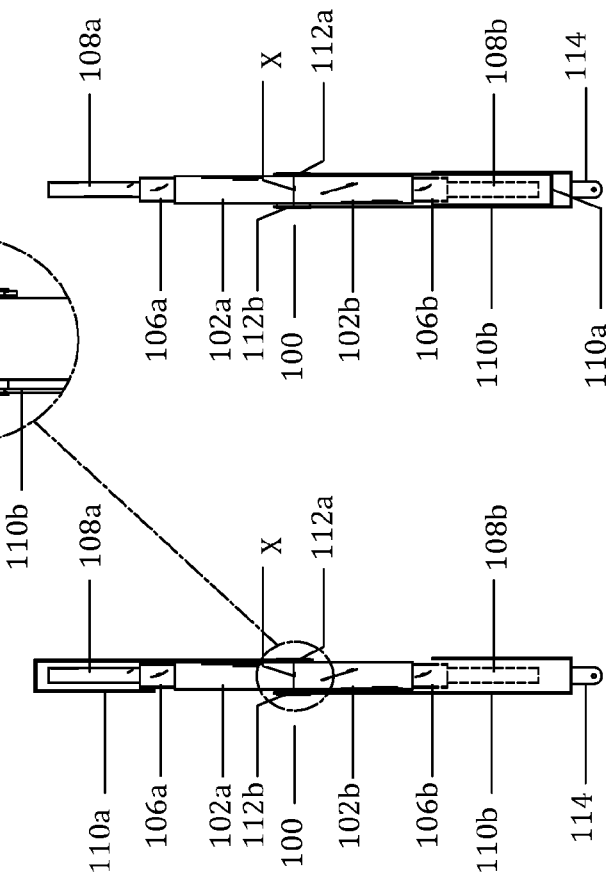

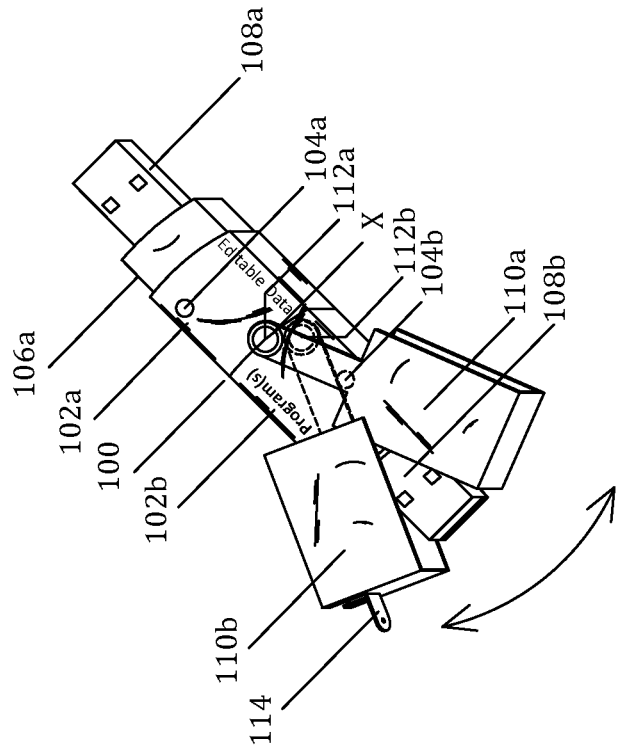
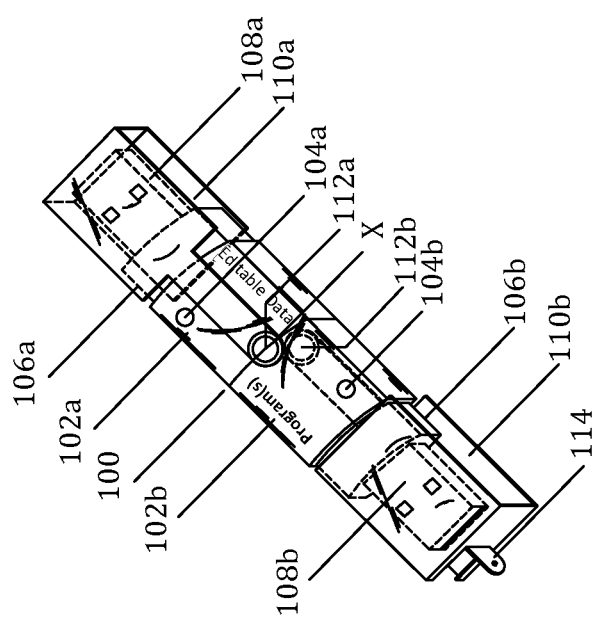

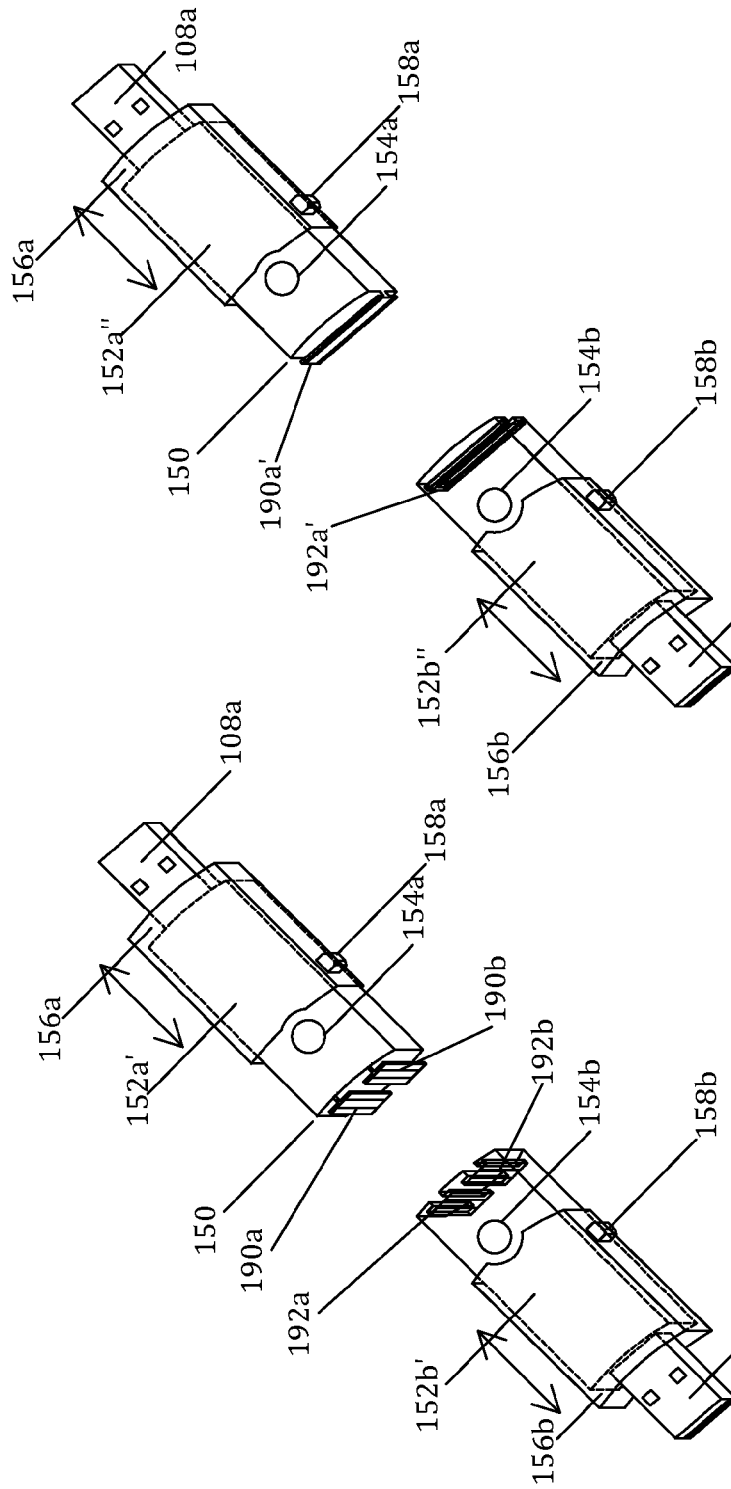

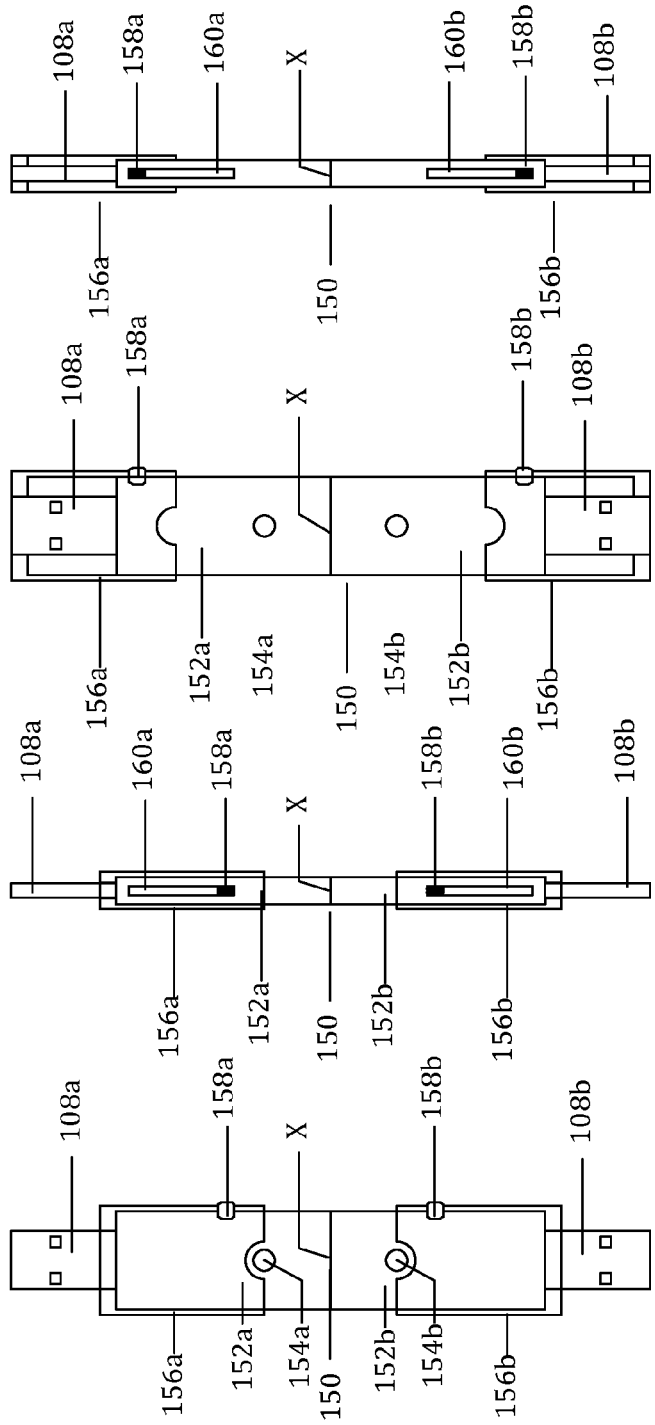

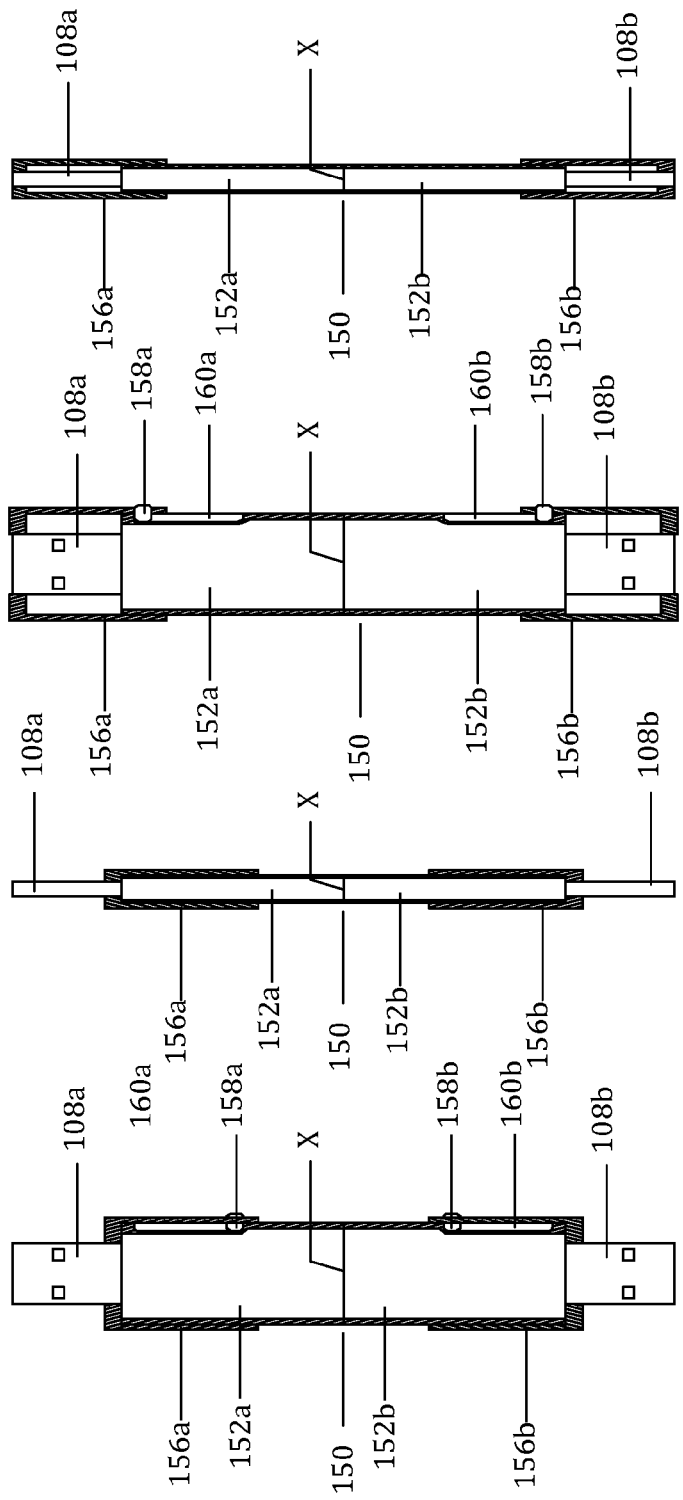

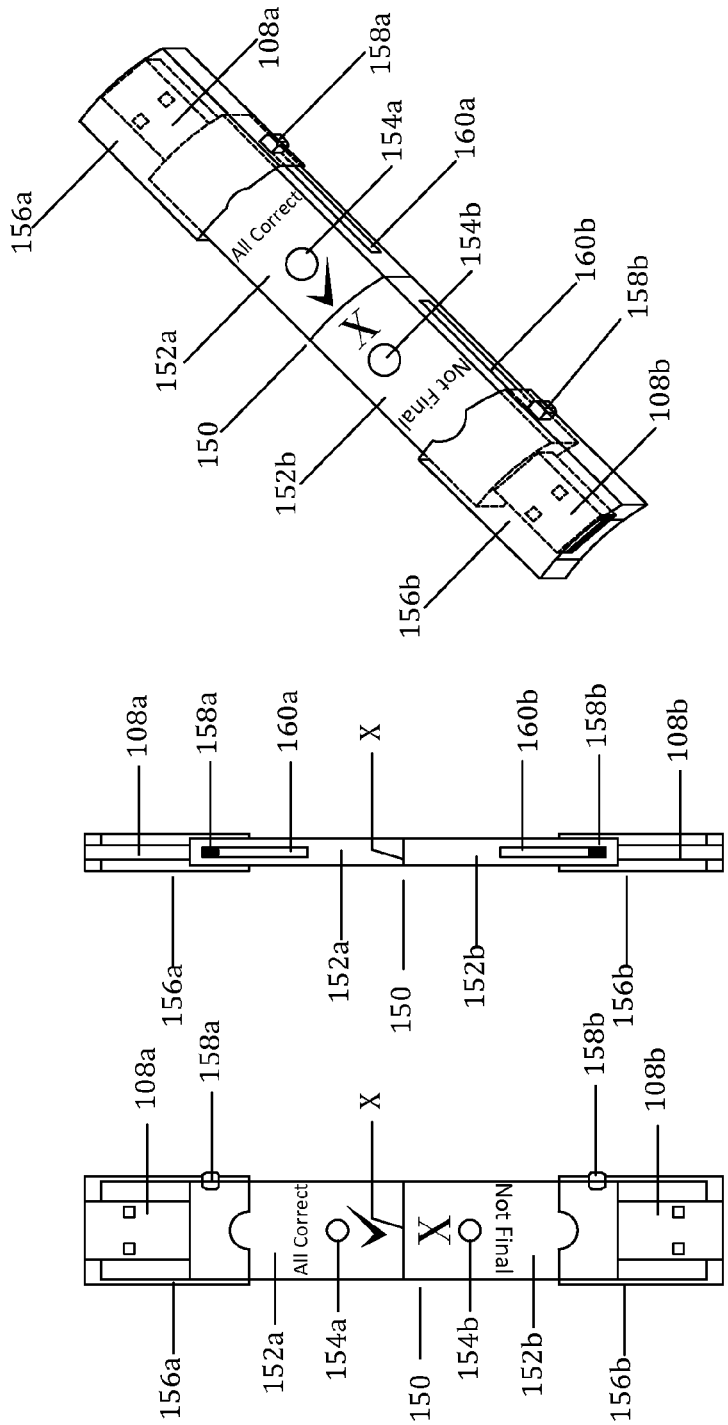

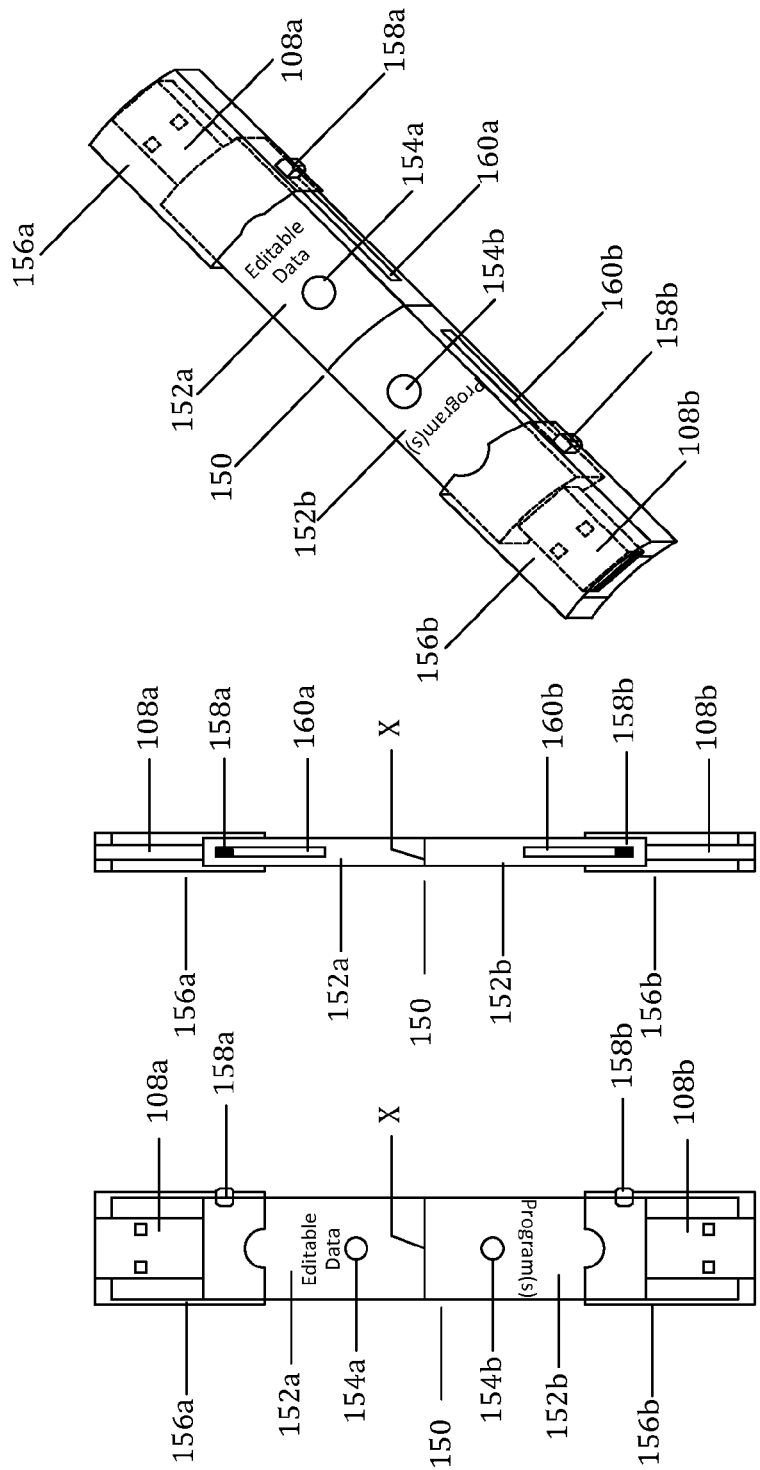

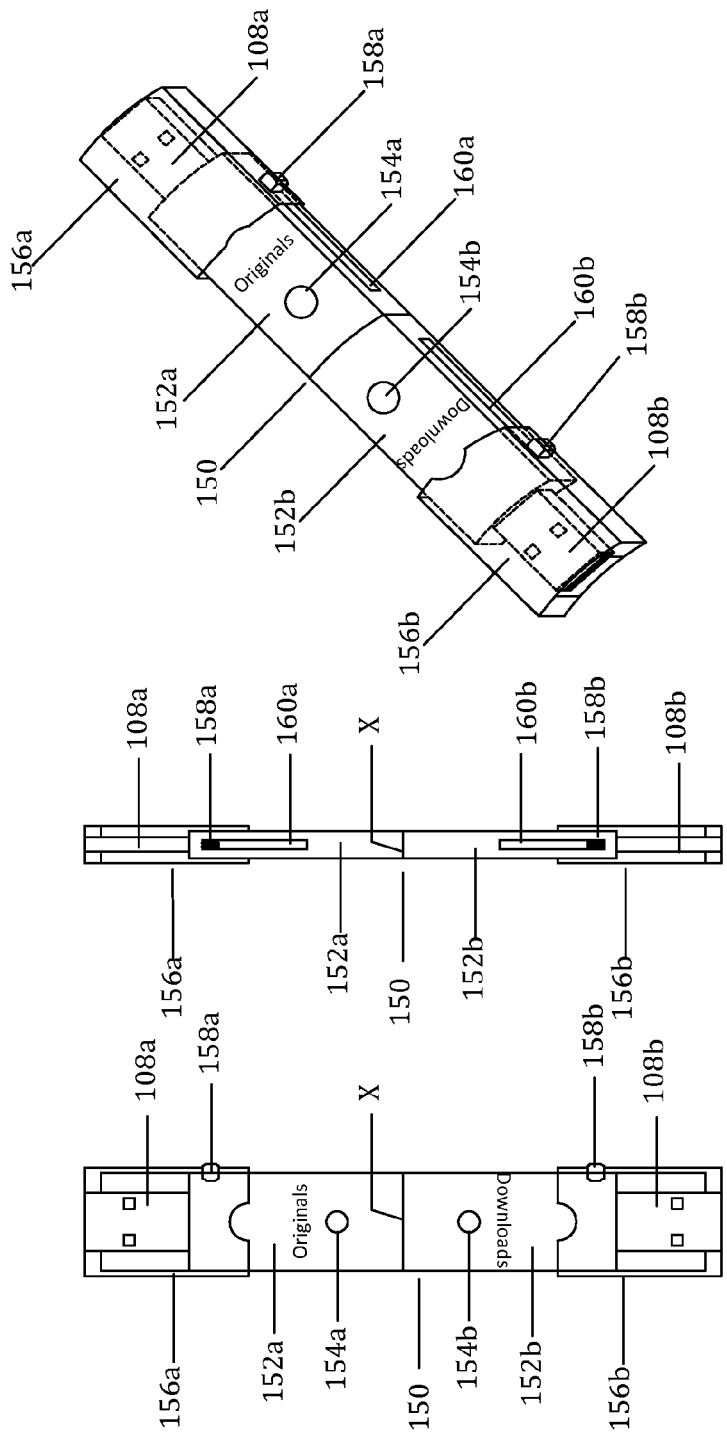

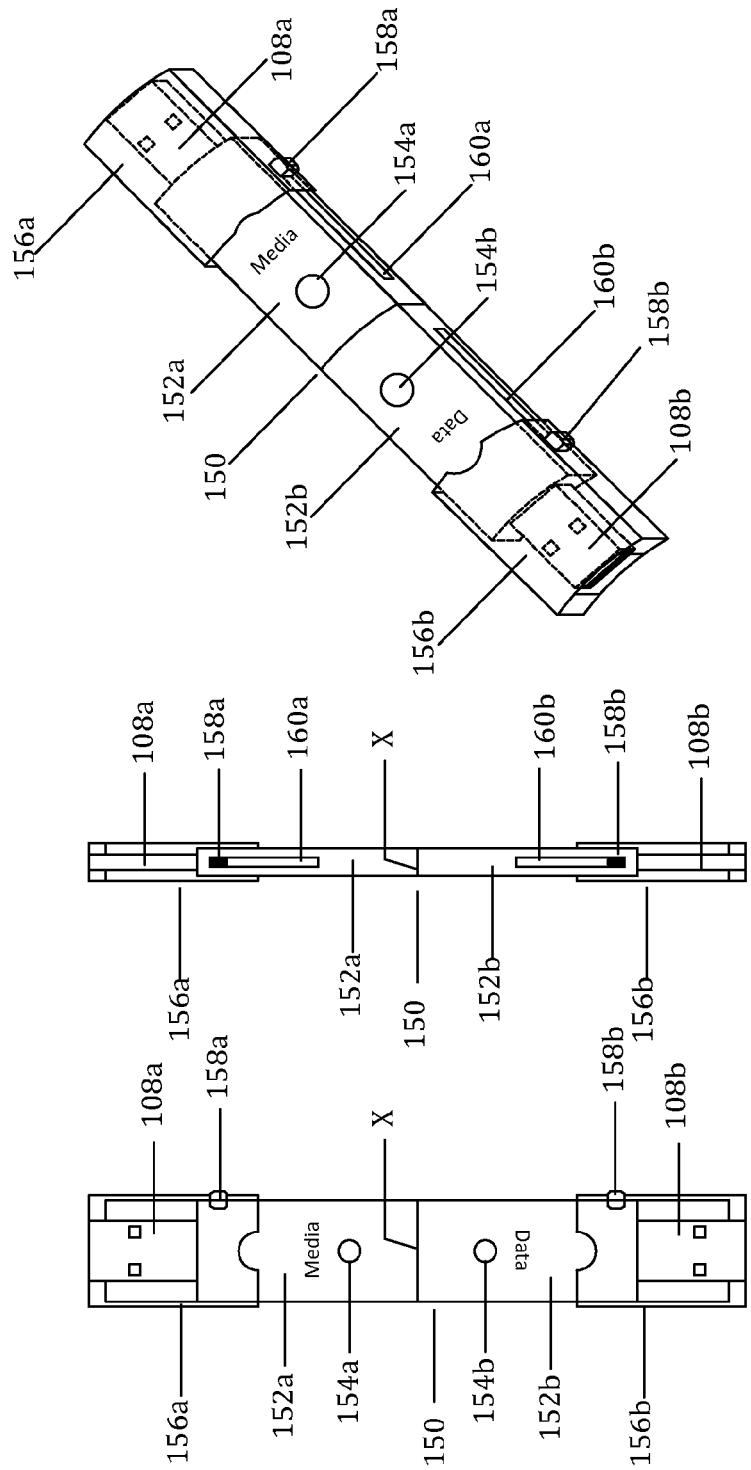

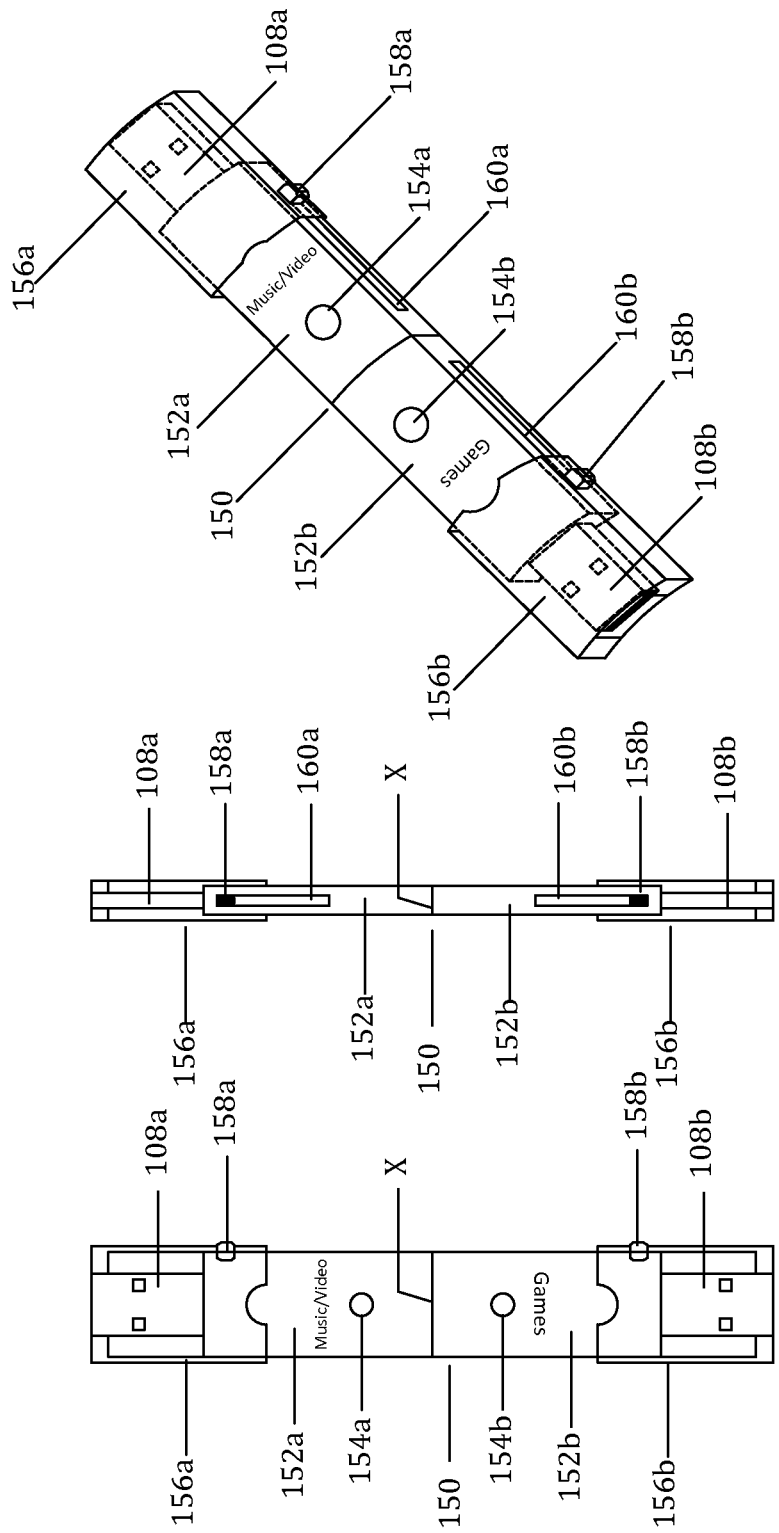

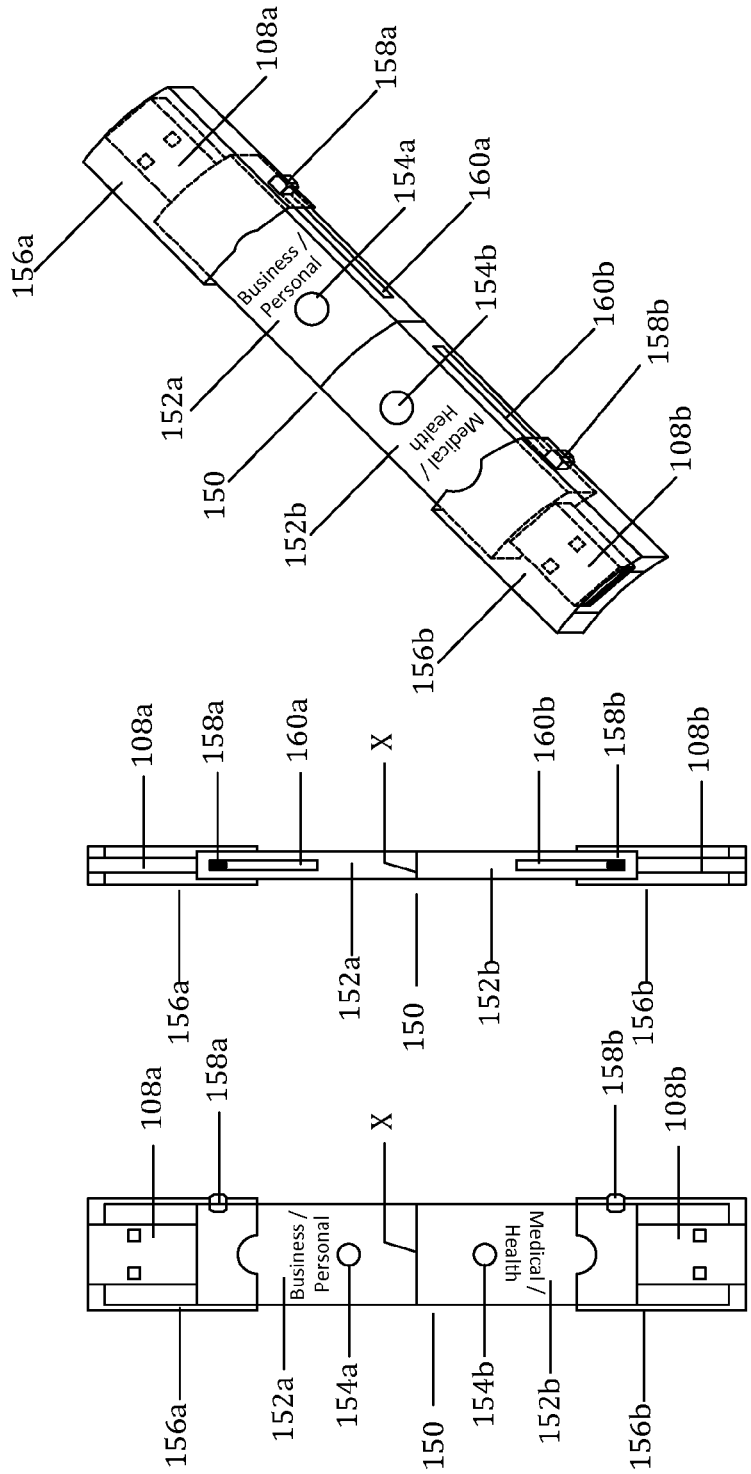

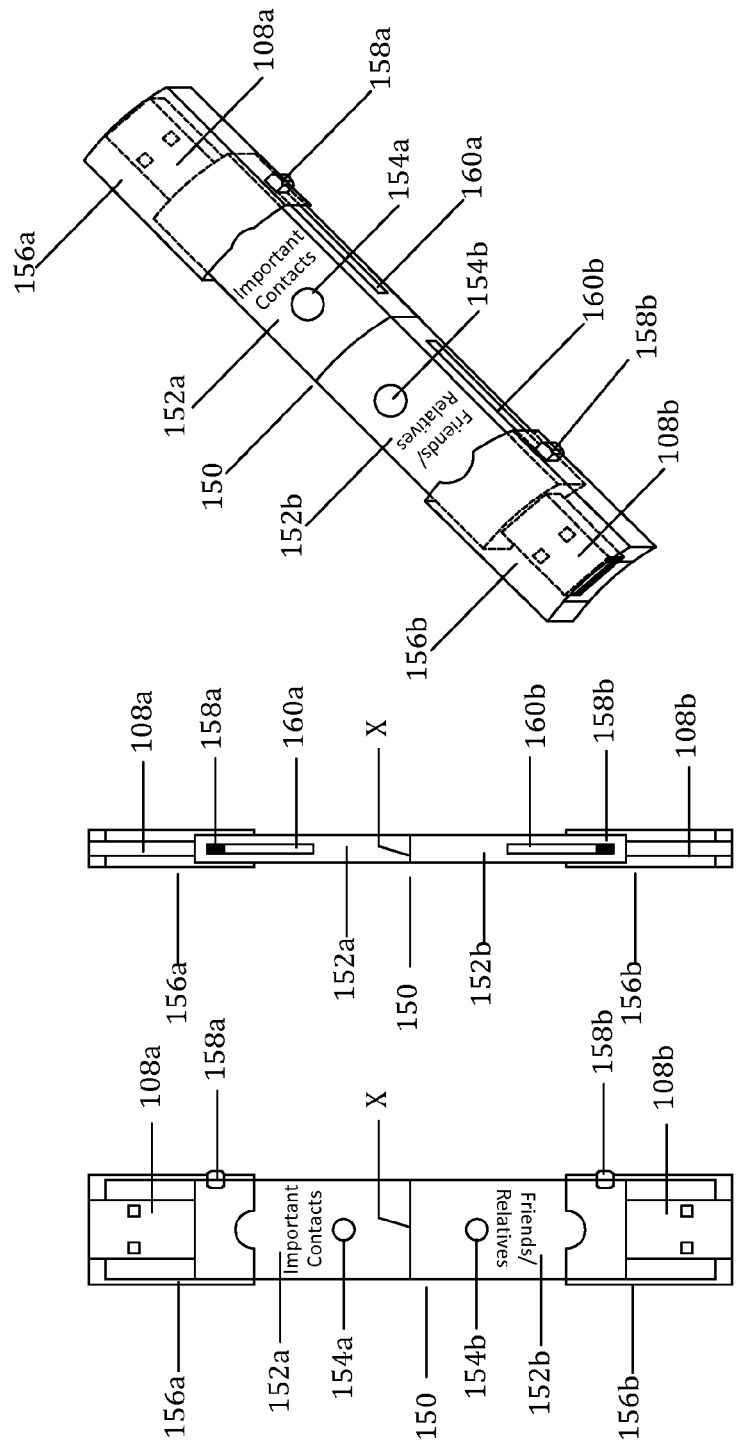

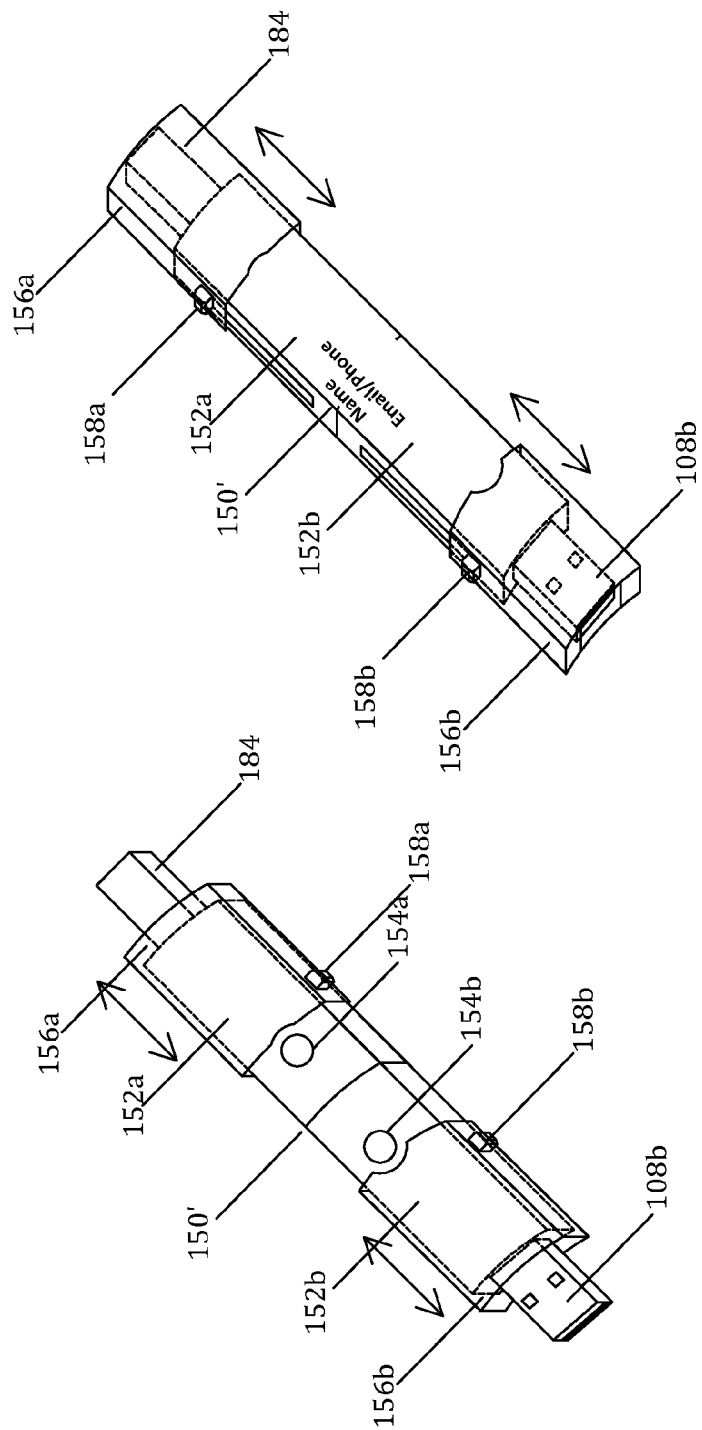

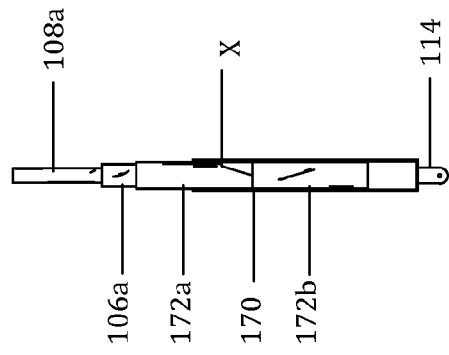
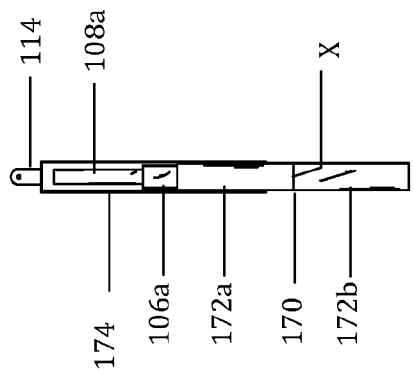
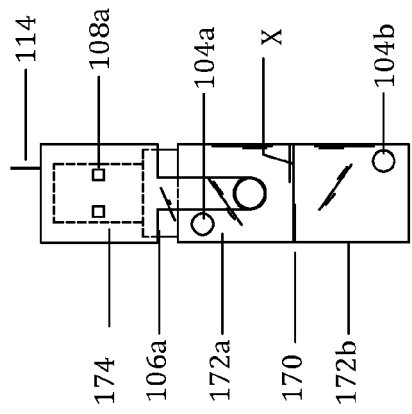
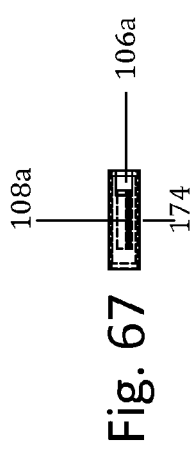

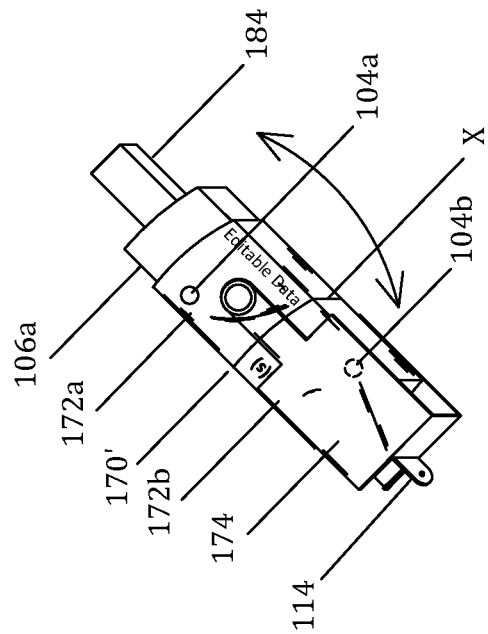
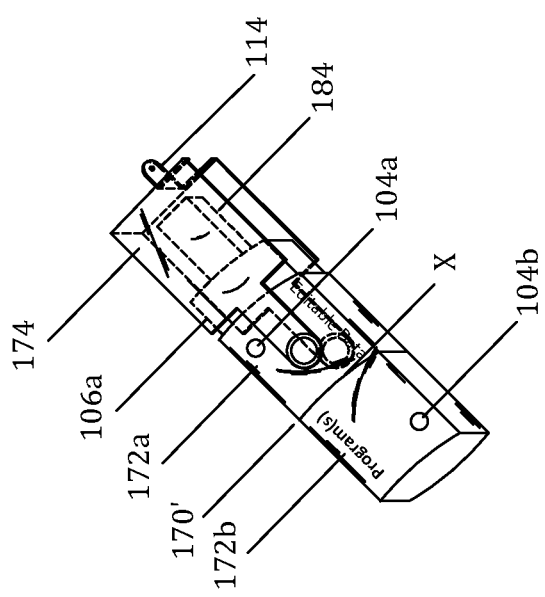

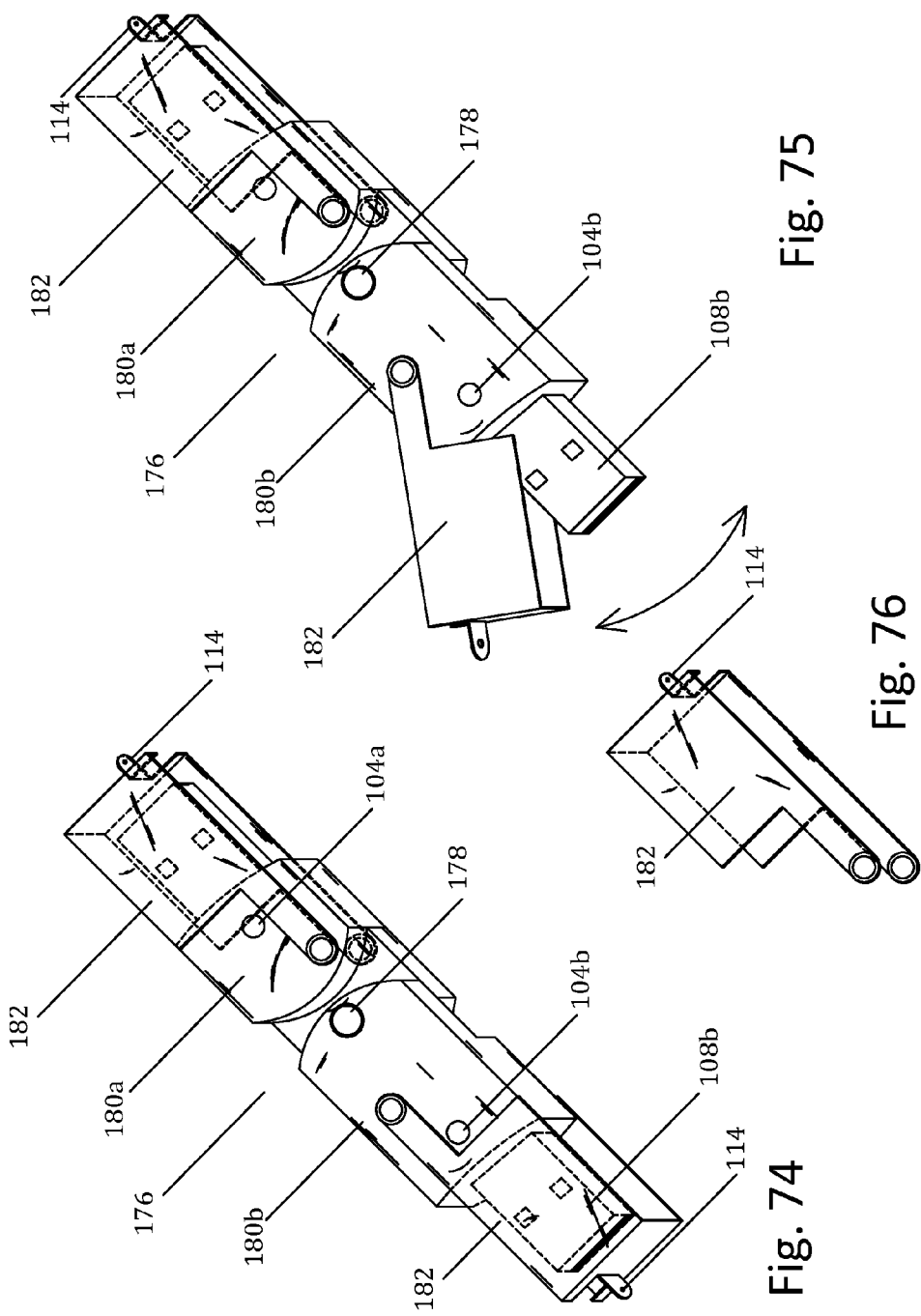

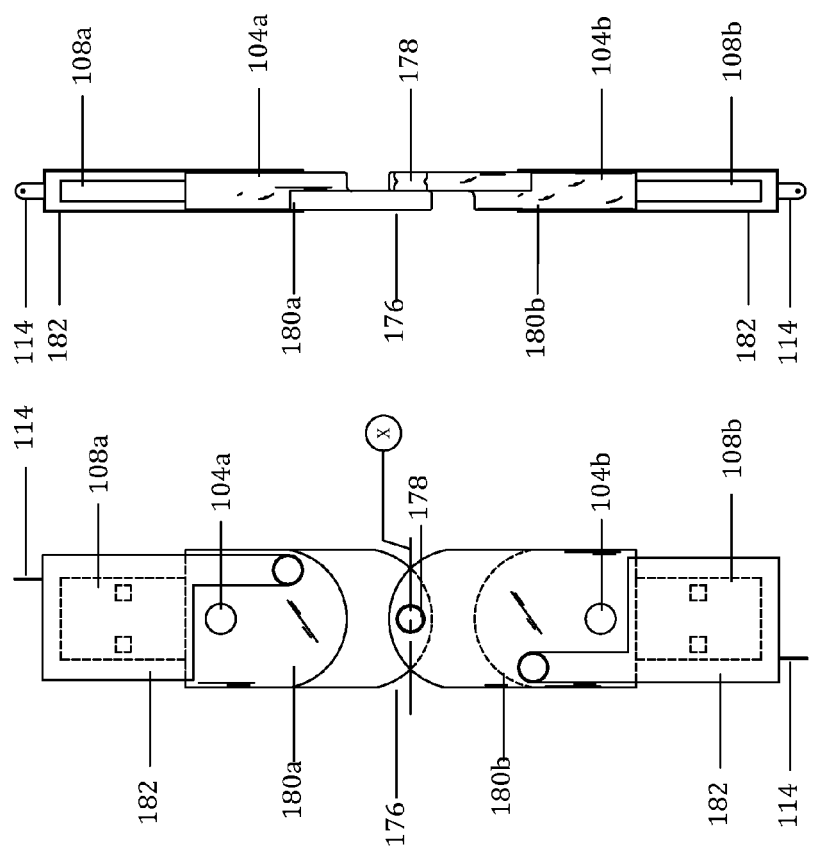

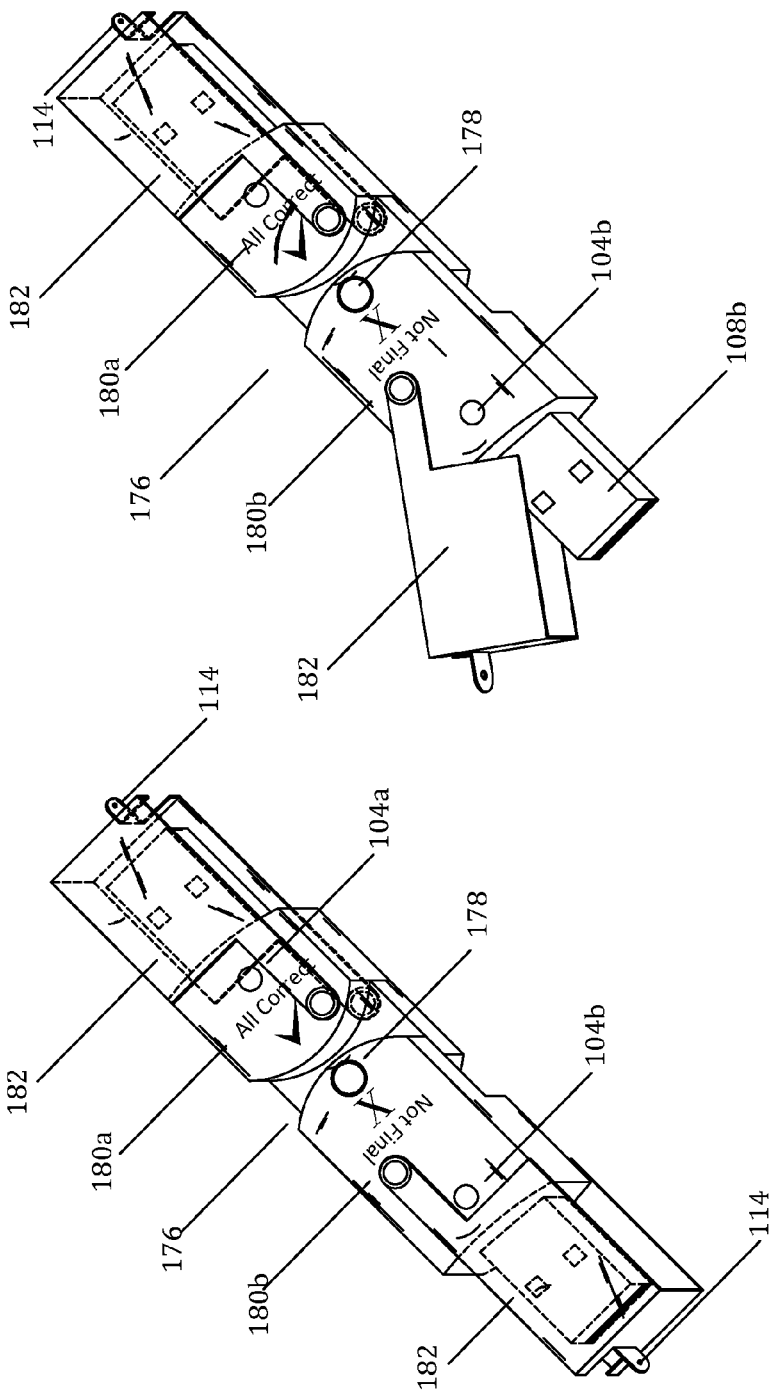

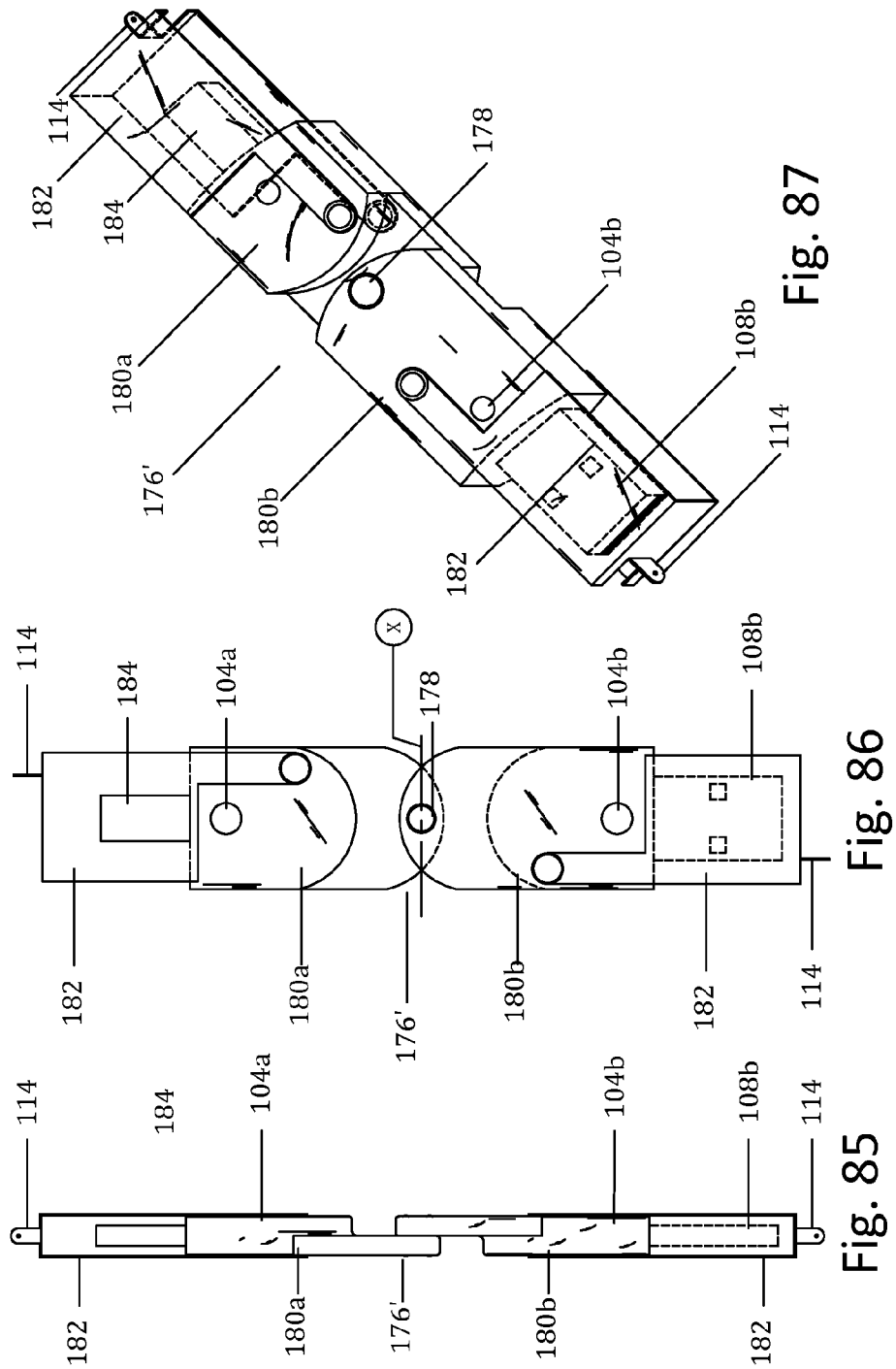

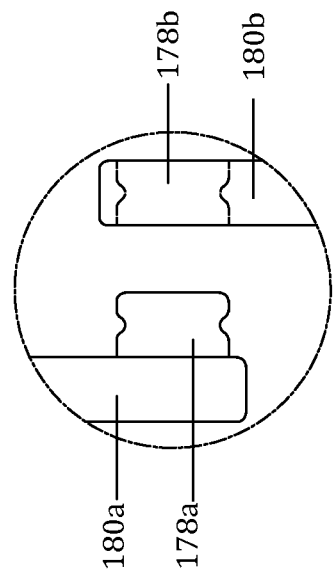

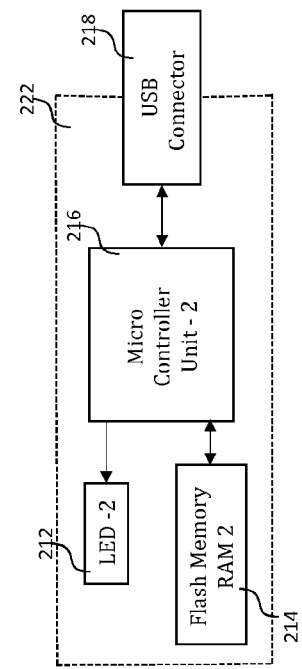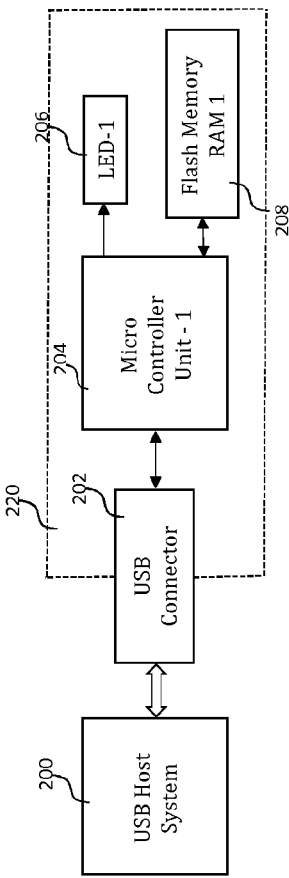
Fig. 95A
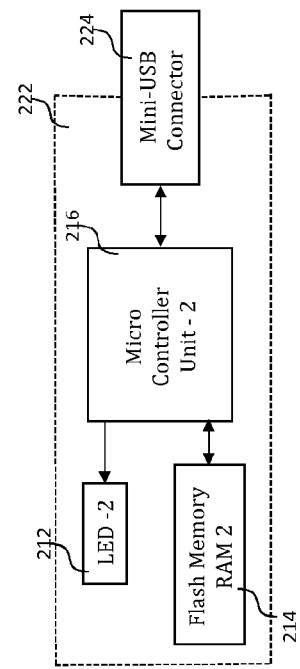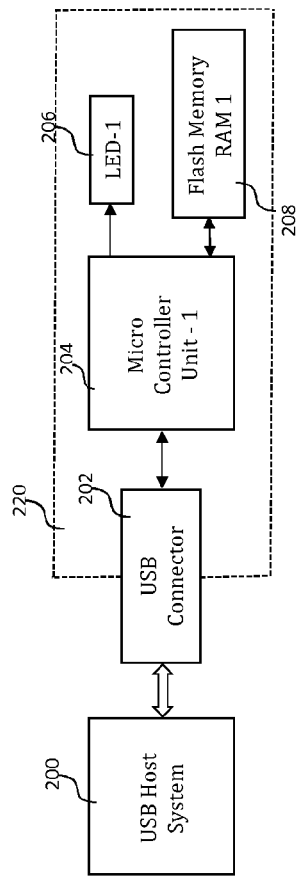
Fig. 95B

PRACTICAL MULTI-PURPOSE COLOR-CODED FLASH DRIVE ORGANIZER WITH COMPARTMENTALIZED SEPARATE MEMORY SECTORS FOR ENHANCED EFFICIENCY AND BETTER EFFECTIVE ANTI-CONFUSION PERFORMANCES IN GLOBAL PERSONAL, EDUCATIONAL, PROFESSIONAL, BUSINESS AND ORGANIZATIONAL WORKS

CROSS-REFERENCE TO RELATED APPLICATION

This utility patent application claims the benefit of provisional patent application Ser. No. 61/574,041 filed 2011 Jul. 27 in the US Patents and Trademark Office by the present inventor.

FEDERALLY SPONSORED RESEARCH

Not Applicable

SEQUENCE LISTING OR PROGRAM

Not Applicable

FIELD OF THE PRESENT INVENTION

The present invention (inclusive of the present inventive device(s), methods and systems generally pertains to high-tech portable data/information storage and retrieval, and, more particularly pertaining to certain new advanced, integrated, sectional, user-friendly, multi-purpose, color-coded Flash Drive Organizer methods, systems and devices that are applicable for upgrading and solving the confusing problems encountered by hundreds of millions of current flash drive or jump drive users around the world; the present invention being very convenient to use, saving precious time, cost-effective and applicable for international multi-language uses in all walks of life, effectively achieving greater organized personal and business electronic data/information exchange, storage, retrieval, display and data editing (in some embodiments), and also effective for personal, entertainment, gaming, educational, organizational and business computer performances, and in some embodiments equipped with software programs and applications for quick installation, and, conducive to achieving better organizational capabilities.

BACKGROUND OF THE INVENTION

Prior Art/Current Art—Related Problems and References as Solvable by the Present Invention, (Inclusive of the Present Inventive Devices, Methods and Systems Because of the small sizes, the almost universal compatibility, and the increasingly low cost and high capacities of flash drives or jump drives, a great many people in various countries have been attracted to their utilities, now and in the last decade, thereby, buying and using flash drives or jump drives (also called memory sticks) as specialized new means of data storage, exchange, retrieval, display and in some cases, data/information being editable, making them become easily very adaptable and popular. Also, many companies in the technological fields have been replacing the installation CDs (usually issued with new software and hardware) with small flash drives or jump drives, thus reinforcing their growing popularity.

However, today's flash drives or jump drives or memory sticks are of one of two types: an open memory for the users to fill up with any kind of data/information and with no limitations other than the devices' storage capacities, or, a closed memory as used by companies to allow the users to see and/or install a particular setup program or software or a particular manual, with not much possibility of writing and editing more additional data for alternative uses of the flash drives or jump drives.

Although these aforementioned multitude of prior art and currently used flash drives or jump drives are of great uses to many millions of worldwide users, there have been many growing problems derived from them, resulting in so much mix-ups, cluttering and confusions among vast numbers of users. The above problems have become really enormous because the prior art and currently used flash drives or jump drives really lack important features, such as lack of organized external visual aids and labeling and deficiency in external utility-designations that are of utmost importance in helping the worldwide flash drive or jump drive users to make their performances of computer-related tasks much easier, less time-consuming and more convenient. So, as a result of the above-mentioned lack of important features and capabilities, based on my experiences as inventor and user of prior-art flash drives, as well as the experiences of countless others, the vast numbers of the prior art and currently used flash drives or jump drives are wastefully bought by millions of users, yet unnecessarily accumulated and scattered around, unlabeled. Moreover, the global users have been and are still being inefficiently hindered and confused in their personal, business, educational, entertainment and organizational tasks due to the lack of organized visual external aids in the prior art and currently used flash drives or jump drives.

Therefore, urgent organized better solutions are long overdue, and must definitely be made and implemented in order to help them in effectively correlating their desired intended tasks with the respective internal components and data/information contained in the RAM files and/or the ROM software contents in the prior art and currently used flash drives or jump drives. Without the much needed long overdue effective organized methods, systems and devices, enormous millions of users of flash drives or jump drives around the world are left unsure in their presentations in-as-far-as what to immediately display or demonstrate during important crucial events. They also get confused in their works in easily delineating what files or projects or programs or specific contents they want to immediately use or work on. If, through the months and years, they have bought and gathered a bunch of unlabeled and disorganized flash drives or jump drives, they are confused as to which flash drive or jump drive to plug into and unplug out from the USB ports (including FireWire or Thunderbolt) ports of theirs or someone else's computers each of the unlabeled and disorganized flash drives or jump drives they have, and, thus lose precious time trying to unravel the confusing contents and files of each one of the used flash drives or jump drives, before they can demonstrate or show the proper files which they want or desire to show and display or to work on. These practices are so inefficient and duly cause so many disappointments, loss of valuable time and confusion among so many millions of global users of current and prior art flash drives or jump drives.

Certain researched patents such as, U.S. Pat. No. 7,793,014 to Paley et al, U.S. Pat. No. 7,632,113 to David Finn, U.S. Pat. No. 8,135,883 to Monks, et al, U.S. Pat. No. 8,195,480 to Lubell, et al, U.S. Pat. No. 6,898,653 to Su, et al, U.S. Pat. No. 8,214,545 to Khan et al, US 2008/0050952 A1 to Paul Regen et al, U.S. Pat. No. 7,717,717B1 to Joseph Lai, US 2009/0111320 A1 to Joseph Johansson et al, U.S. Pat. No. 7,537,471 B1 to Mordechai Teicher, for examples, do not really offer to provide the numerous millions of flash drive or jump drive global users with the easy multi-purpose anti-confusion practical better user-friendly efficiency and convenience and specific color-coded features and values in a variety of situations and utilities as in the present invention for achieving faster broader varieties of applications in educational, business, professional, personal, medical, entertainment and other organizational affairs.

The present invention offers a vast myriad of organized solutions to the above-mentioned problems and shortcomings encountered in the varied uses of current and prior-art flash drives or jump drives. Therefore, the present invention can really be of truly great aid to the hundreds of millions of future flash drive or jump drive users all over the world.

The present invention, inclusive of the present inventive devices, methods and systems, having the integrated and advantageous uniqueness, comprehensiveness and user-friendliness and convenience being offered globally to hundreds of millions of future users in all walks-of-life, has been invented and designed to be very effective innovative hybrid of flash drives or jump drives, with vast and varied improvements over the prior-art types of flash drives or jump drives afore-mentioned above, in order to provide the best of both worlds to the global users for multi-purpose practical and ease of use effective many fields of computer-related endeavors, and thus will amazingly ignite the world market with immense broader spectrum of worldwide customers demands.

Emphasizing, moreover, the present inventive devices, methods and systems have been designed and invented with the end-users in mind, presenting compact devices with protected interface connectors, making them robust and suitable for hundreds of millions of international users from all walks of life.

PRESENT INVENTION, (INCLUSIVE OF THE PRESENT INVENTIVE METHODS, SYSTEMS AND DEVICES

Introduction and Important Clarifications

In order to clearly understand the patent writings, specifications, descriptions, explanations and illustrations in the present invention (inclusive of the present inventive methods, systems and devices), and avoid confusion, whenever the phrase "present invention" is used or mentioned, it means as equivalent (but not limited in scope, embodiments, features and functions) to the new presently applied for invention (inclusive of the present inventive devices, methods and systems) as described in the present patent application, specifications, descriptions, explanations, illustrative drawings, legends and claims; it is also equivalent to, or meaning the same thing as "present device" or "present inventive device" or "flash drive organizer device" or "Practical Multi-Purpose Color-Coded Flash Drive Organizer with Compartmentalized Separate Memory Sectors for Enhanced Efficiency and Better Effective Anti-Confusion Performances in Global Personal, Educational, Professional, Business and Organizational Works". The present invention is also called "Multi-Purpose Color-Coded Hy-Brex Flash Drive Organizer," or "EucliStar Hy-Brex System," or "Hy-Brex Device."

SUMMARY OF THE PRESENT INVENTION

Inclusive of the Present Inventive Device(s), Methods and Systems

Some of the general and specific objects with achievable advantages (but are not limited in scope, designs, embodiments, functions, features and capabilities as described, explained and illustrated) of the present invention (inclusive of the present inventive methods, systems and devices) or "Practical Multi-Purpose Color-Coded Hy-Brex Flash Drive Organizer" or "EucliStar Hy-Brex System" or "Hy-Brex Device" are included in the following:

1) One of the main objects with achievable advantages of the present invention (inclusive of the present inventive methods, systems and device(s) is to be able to provide more effective broader range and scope of applications to hundreds of millions of global users of flash drives or jump drives and offer them advantageous benefits with new hybrid, practical flash drives or jump drives (with combination or without combination of mini-USB or micro-USB or FireWire or Thunderbolt), having color-coded external sectors (with differentiated color-coded specific LED signaling means) in order to easily and instantly aid millions of these users of said new EucliStar Hy-Brex System or Hy-Brex Device in physically distinguishing which specific particular functional sector of said new EucliStar Hy-Brex System or Hy-Brex Device that he or she would like to plug to a host computer and actively work on, and which certain particular data/information/picture/video/music/games, etc. is to be activated and shown at a particular compatibly linked monitor, or from which organized sector of said present device to select for sending or storing emails or downloads, or in which particular sector of said present device to work on for editing or modifying data/information and/or other relevant data/information or items or files, through a respectively plugged-in host computer, or to work on for printing purposes.

2) Another object of the present invention (inclusive of the present inventive methods, systems and devices) is to achieve much easier time-saving convenience and performance for worldwide users of the present invention and, also to provide more organized non-confusing, time-efficient and cost-saving data/information entry, retrieval, display, editing, modification, exchange, transmission and reception, and having provisions (in some embodiments of the present invention) to enable the global users of the Hy-Brex Flash Drive Organizer to mix-and-match various desired functional sectors with the respectively desired interface connectors to be interchanged for effective greater and broader users' range of performance advantages adaptable for the newer, more advanced practical multi-purpose flash drives or jump drives of the present invention.

3) Yet, another important object with achievable advantage of the present invention (inclusive of the present inventive methods, systems and devices) is to be able to provide to the hundreds of millions of worldwide users a variety of embodiments, based on the same present inventive device, methods and systems described in this present patent specifications; said embodiments may differ in external factors such as shapes and sizes and color coding, but also in internal factors, such as the number of micro-processors, the number of RAM units, or the types of interface connectors used to connect to the respective compatible host system. Following today's technologies, these connectors may be of any combination of standard USB connector, a mini-USB connector, a micro-USB connector, a FireWire 400 connector, a FireWire 800 connector, or a Thunderbolt connector. However, this present inventive device can also be built in a way that will allow future embodiments to provide connectors for technologies that have yet to be developed and standardized and may provide faster data transfer rates.

4) Still another object of the present invention is to offer practicality of use by virtue of its being easily and visually capable of showing the users which preferred labeled sector he or she would like to work on or show through the respective compatible host computer and linked monitor by means of physically and easily distinguishing the chosen sector through color-coded means and printed markings on the particular sector's portion with the corresponding LED signaling means, so as to achieve better compartmentalized organizational functionality of the present inventive flash drive to facilitate the users of said present invention or present inventive device with better organized memory compartments for instant Plug-and-Play and/or plug-and-show and/or plug-and-edit accesses to various programs, software, and various other data pre-programmed or stored into the memory, and, which also include specific compartments or partitions for entering rewritable data, and to distinguish which sector is made final, and which sector is made to still be editable, thereby attaining more enhanced important values in the field of personal, entertainment, educational, professional, organizational and business affairs.

5) And, yet another further objects of the present invention (inclusive of the present inventive devices, methods and systems) are to easily delineate to the user certain external differential color-coded appearance of definite sectors of the new inventive flash drive, with labels on one and/or both faces or areas or on the same face, wherever the labeling spot is more practical and convenient; examples of labels which are definitely enumerated can be as follows:
a) Not Final data versus All Correct data
b) Programs(s) versus Editable Data
c) Download files versus Original files
d) Media files versus Data files
e) Games versus Music/Video files
f) Medical/Health data versus Business/Professional data
g) Friends/Relatives contacts versus Important Contacts These are only examples of the possible sectors to be labeled for easier external marking labels, but not limited only to these above-cited and illustrated sectors and labels.

6) Yet another further object with achievable advantages of the present invention (inclusive of the present inventive methods, systems and devices) is such that the new present inventive flash drives can be externally distinguishable, and yet better organized as to the subject matter, name of the owner, contact phone and contact email and dates: these information can be attached with convenient properly-sized stick-on printed labels at whichever face of the new inventive flash drive is available and easily distinguishable or convenient or at whichever cover face of the new inventive flash drive can be legibly written on with indelible ink at the respective designated labeling areas, by the respective users to make them easier to trace in case the devices are lost or misplaced and for the sake of saving time and effort in the organization of data/information and programs are concerned.

7) And, another yet further object with achievable advantages of the present invention (inclusive of the present inventive methods, systems and devices) is to be able to provide several variations in the body of the second embodiment, so that both sectors of the present inventive device could be manufactured so as to be interchangeable, thus allowing for a greater number of possible combinations using the various interface connectors, and thereby providing for higher combinational compatibility rate. The data transfer between the two halves or sectors of said present inventive device would be achieved through gold-plated electrical connectors on both halves that would form an optimal electrical connection when the two halves of said second embodiment of said present inventive device are linked together.

All of the above features, functionalities and capabilities cited in the objects with achievable advantages of the present invention, with the corresponding relevant inventive methods, components, parts and systems involved in the present inventive device(s) or "Practical Multi-Purpose Color-Coded Hy-Brex Flash Drive Organizer" will become apparent as further discussed, explained and elaborated in the following Brief Summary, Descriptions and Explanations of Various Illustrative Figure Drawings and Representations, as well as included in following Detailed Descriptions, Explanations and Discussions in the present patent application and patent specifications and claims.

BRIEF DESCRIPTIONS AND EXPLANATIONS OF VARIOUS ILLUSTRATIVE FIGURE DRAWINGS AND REPRESENTATIONS

FIG. 5 is an orthographic representation of the frontal view of the first embodiment of the present inventive device, with the caps closed, protecting the USB connectors.

FIG. 6 is the left side view of the first embodiment of the present inventive device, with the caps closed, protecting the respective USB connectors.

FIG. 6A is a close-up view of the center of the first embodiment of the present inventive device, as taken from FIG. 6 (central part in broken-line-circled portion) and magnified, illustrating how the caps are connected to the main body of the first embodiment of the present inventive device.

FIG. 7 is the left side view of the first embodiment of the present inventive device, with the top cap having of smaller dimension and swung all the way to the bottom, and accommodated underneath the bottom cap for full superposition. This is achieved by having the caps connected on opposite sides of the main body, as shown as magnified in FIG. 6A, taken from the circled central portion of FIG. 6.

FIGS. 8 and 9 illustrate the end view of the bottom USB connector enclosed within the respective cap, and end view of the upper USB connector enclosed within the respective cap of the first embodiment of the present device, with the respective caps covering the respective connectors.

FIGS. 10-23 illustrate several possible labeled uses of the first embodiment of the present inventive device, showing examples of various labeled combinations of external organizational sectors as mentioned earlier in this present patent specification.

Figure 23:
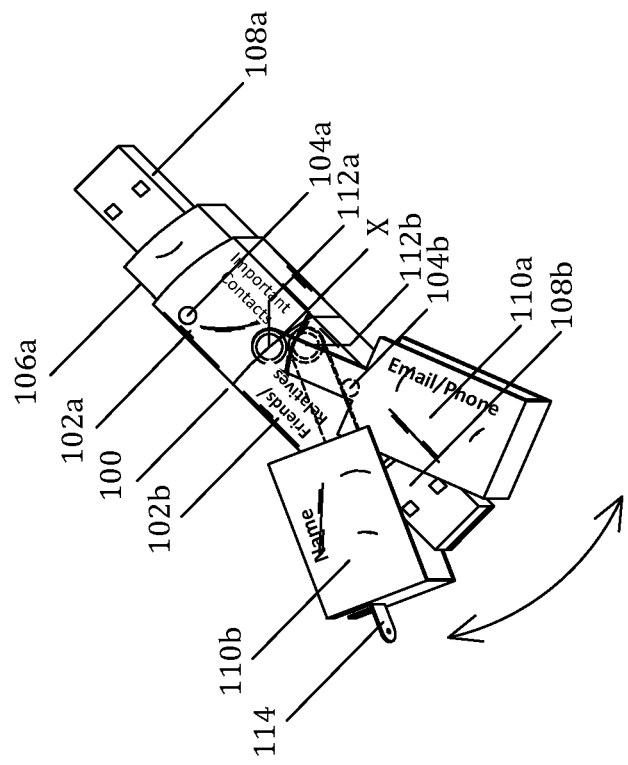
Figure 22:
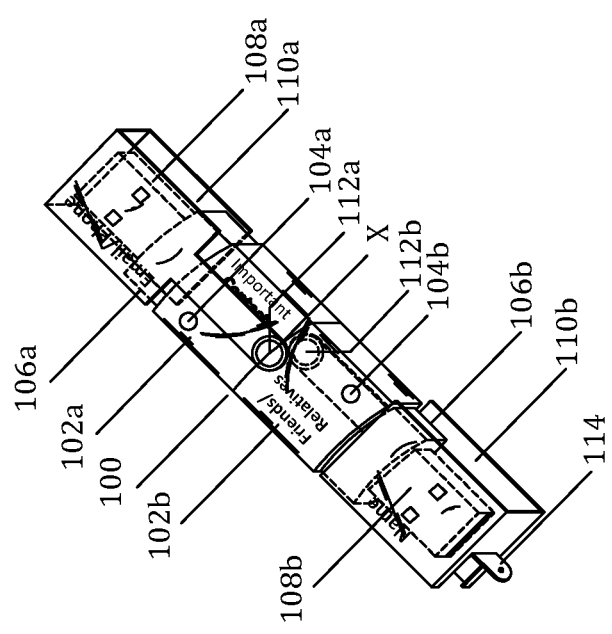

FIGS. 22 and 23 also illustrate how additional information could be displayed on the present inventive device by modifying the end caps to create some writable areas on which the owner or user of said present inventive device could add personal information.

Figure 25:
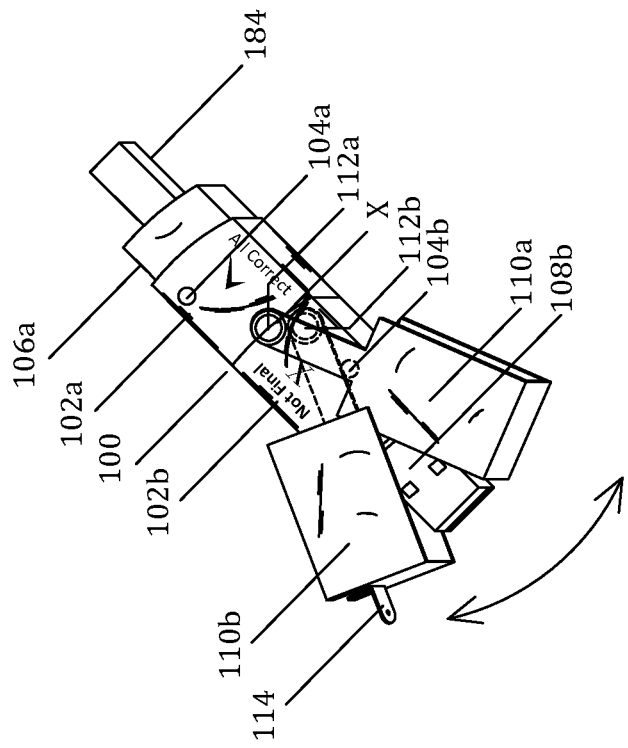
Figure 24:
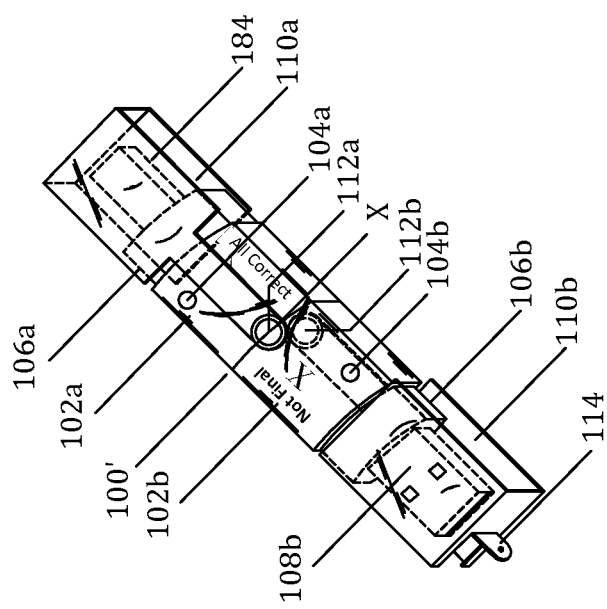

FIGS. 24 and 25 represent a variation of the first embodiment of the present inventive device, wherein one of the 2 standard USB connectors is replaced by a mini-USB or a micro-USB connector, or could even be replaced by a FireWire connector or a Thunderbolt connector, or even a connector for a yet undeveloped data transfer technology.

Figure 26:
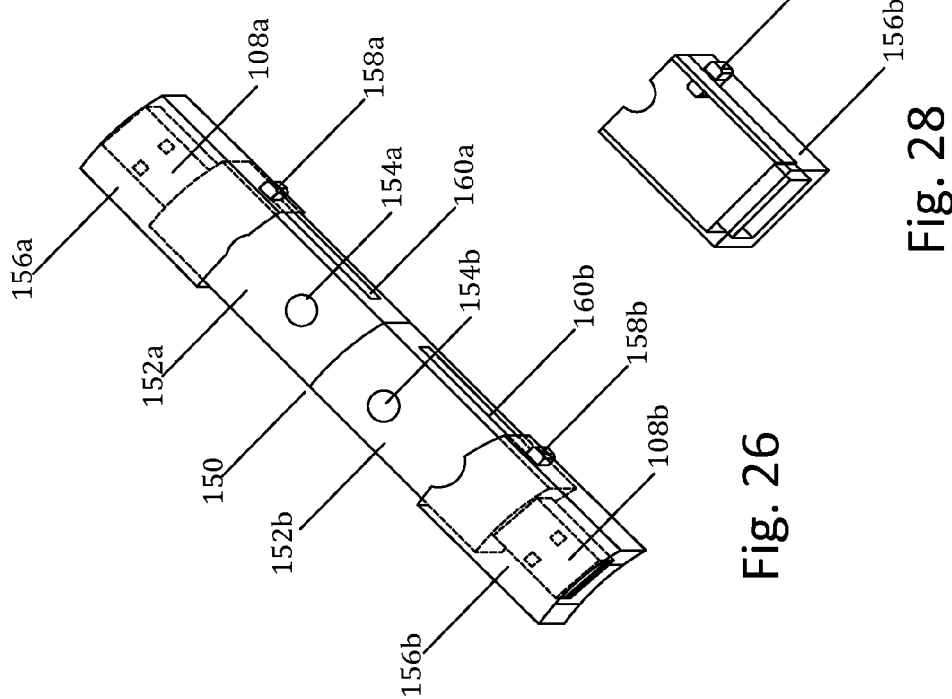

FIG. 26 is a perspective view of the second embodiment of the present inventive device. While the first embodiment shows the end caps that swing on either side of the USB connectors, this second embodiment has end caps that slide back and forth to alternately reveal and protect the USB respective connectors. This perspective view illustrates as favoring the frontal face view and also showing partially the left side view and the bottom view of the same second embodiment.

Figure 27:
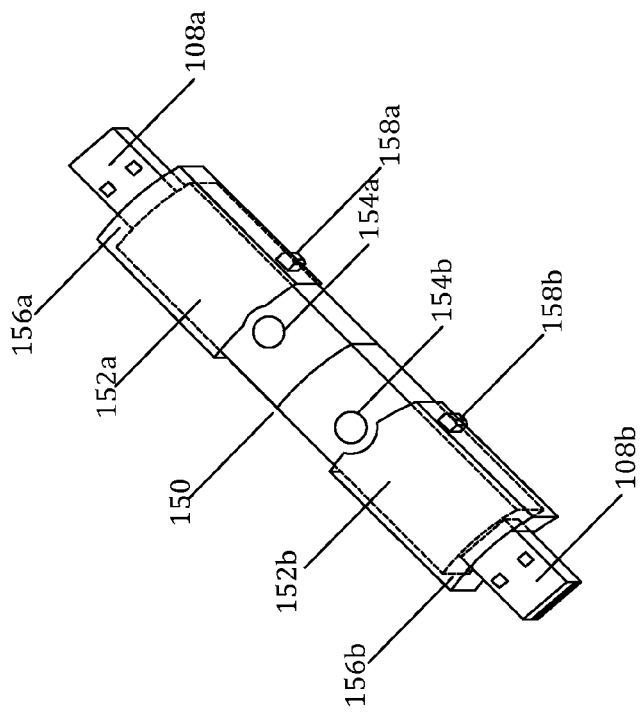

FIG. 27 is another perspective view of the second embodiment of the present inventive device, illustrating the embodiment with the caps being pulled back to show the USB connectors on each end of the said second embodiment.

FIGS. 27X and 27Y are illustrations representing variations in the body of the second embodiment, illustrating how both halves or sectors of the present inventive device could be manufactured so as to be interchangeable, allowing for a greater number of possible combinations using the various connectors, thus allowing for higher compatibility rate. The data transfer between the two halves or sectors of said variation of the second embodiment of said present inventive device would be achieved through electrically adaptive complementary conductive gold plates on both halves or sectors that would form an optimal electrical connection when the two halves or sectors are properly electrically linked together.

Figure 28:
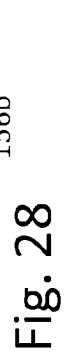

FIG. 28 is a perspective view of the detached cap that is used on the bottom end of the second embodiment of the present inventive device to cover and protect the bottom USB connector; said perspective view of the detached cap illustrates as favoring the frontal face view, partial left side view and bottom view of the end cap. A similar cap when flipped 180 degrees over the longitudinal front face of the second embodiment is shown as attached to the upper half of the second embodiment, but illustrated as pulled back to expose the upper USB connector.

FIGS. 29-32 are orthographic representations of the second embodiment of the present inventive device. FIGS. 29 and 30 show the second embodiment with the caps in the uncovering locked position (front view and left side view, respectively), and FIGS. 31 and 32 show the same second embodiment with the caps in the covering locked position (front view and left side view, respectively).

FIGS. 33-36 are orthographic representations of the same views and states (uncovering locked position and covering locked position) as in FIGS. 29-32. However, FIGS. 33-36 show sectional views of the second embodiment of the present inventive device, illustrating the sliding and locking/unlocking mechanism for the end caps.

FIGS. 37-57 are illustrations of several combinations of organizational sectors as mentioned above in this present patent specification.

FIGS. 58 and 59 represent a variation of the second embodiment of the present inventive device, wherein one of the 2 standard USB connectors is replaced by a mini-USB connection or a micro-USB connector, or could even be replaced by a FireWire connector or a Thunderbolt connector, or even a connector for a yet undeveloped data transfer technology. FIG. 59 also illustrates the back side of the second embodiment of the present inventive device, which reveals a writable area for the owner or user of said second embodiment to add personal or specific information.

Figure 60:
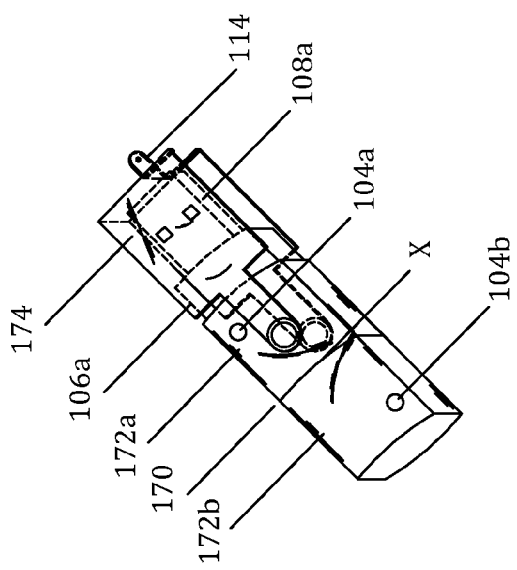

FIG. 60 is a perspective view of the third embodiment of the present inventive device. Similar to the first embodiment, this embodiment has a swinging end cap that will protect its USB connector. However, unlike the previous two embodiments, it only has one USB connector, allowing for a more compact size while still providing for two separate memory cells for organizational purposes. This perspective view illustrates as favoring the frontal face view and also showing partially the left side view and the bottom view of the same embodiment.

Figure 61:
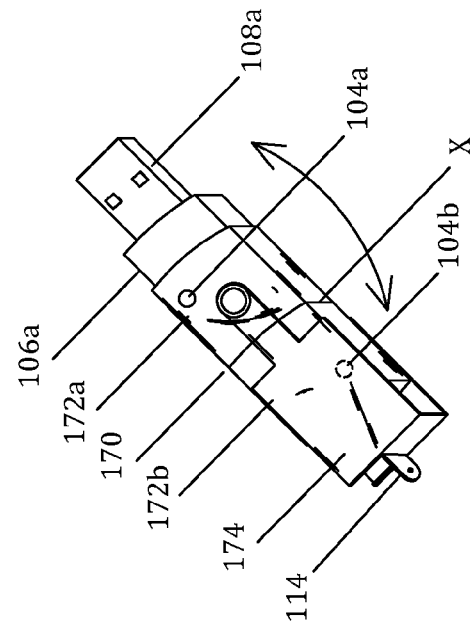

FIG. 61 is another perspective view of the third embodiment of the present inventive device, illustrating the embodiment with the end cap being swung to the other end of the device to show the USB connector.

Figure 62:
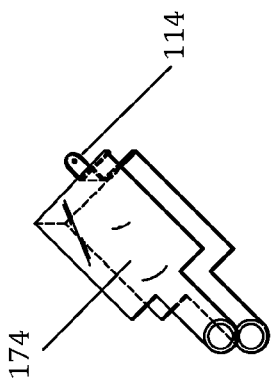

FIG. 62 is a perspective view of the end cap that is used to cover and protect the USB connector on the end of the third embodiment of the present inventive device; said perspective illustrates as favoring the frontal face view and also showing partially the left side view and the bottom view of the end cap.

FIGS. 63-67 are orthographic representations of the third embodiment of the present inventive device, showing the front view (FIG. 63), the side view (FIG. 64), the side view with the cap open (FIG. 65), the bottom view (FIG. 66) and the top view (FIG. 67).

Figure 69:
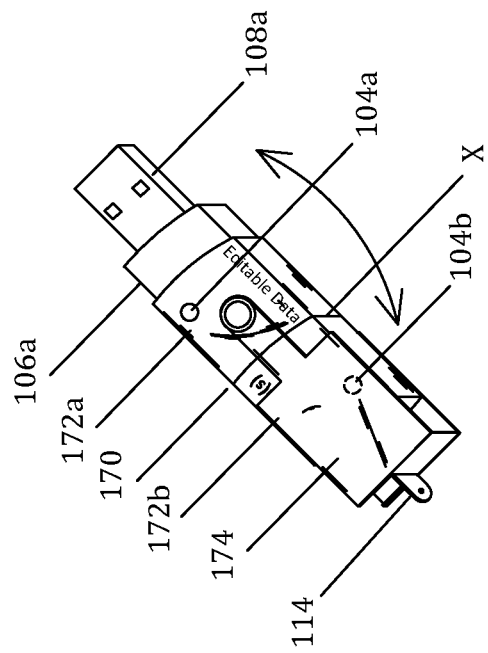
Figure 71:
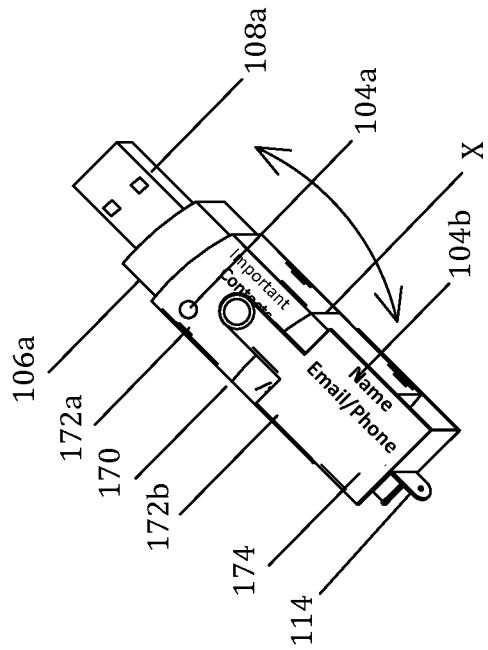
Figure 70:
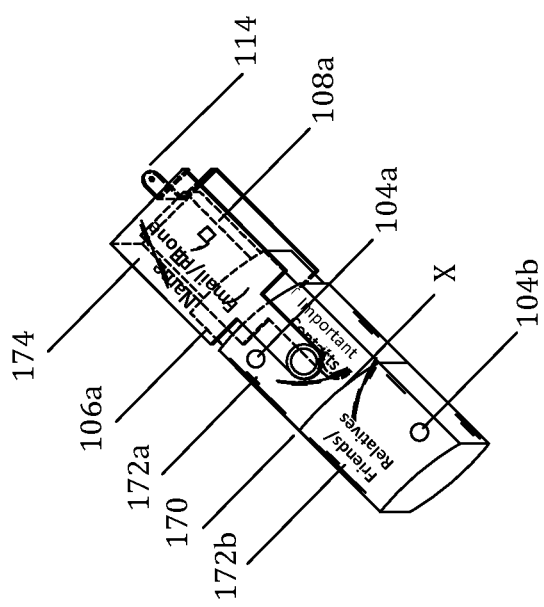

FIGS. 68-71 illustrate several combinations of organizational sectors as mentioned above in the present patent specifications. FIGS. 70 and 71 also illustrate how an additional writable area could be added to the device's end cap and main body external sector to allow the owner or user to add more information, either personal or content specific.

FIGS. 72 and 73 illustrate a variation of the third embodiment of the present inventive device wherein the USB connector has been replaced by a mini-USB connector or a micro-USB connector, or could even be replaced by a FireWire connector or a Thunderbolt connector, or even a connector for a yet undeveloped data transfer technology.

FIG. 74 is a perspective view of a fourth embodiment of the present inventive device. Similar to the first embodiment, it possesses two USB connectors and the end caps swing in and out to cover and protect the USB connectors, but one major difference is that the main part of the body is now hinged, allowing each side of the body (i.e. each memory cells) to rotate from one another in order to be adjustable when plugged in or during transport. The halves are also detachable at the hinge, which allows the user to swap either half to create any combinations with standard USB, mini-USB, micro-USB, FireWire, Thunderbolt, or any other connectors, according to the user's needs.

FIG. 75 is another perspective view of the fourth embodiment of the present inventive device, illustrating the embodiment with one of the end caps being swung to the side to show and expose the lower USB connector, and the upper end cap covering the upper USB connector.

FIG. 76 represents the end cap that can be used on either of the two end of the fourth embodiment of the present inventive device to cover and protect the USB connectors. The perspective view illustrates as favoring the frontal face view and also showing partially the left side view and the bottom view of the end cap.

FIGS. 77-78 are orthographic representations of the front view and the left side view of the fourth embodiment of the present inventive device.

Figure 79:
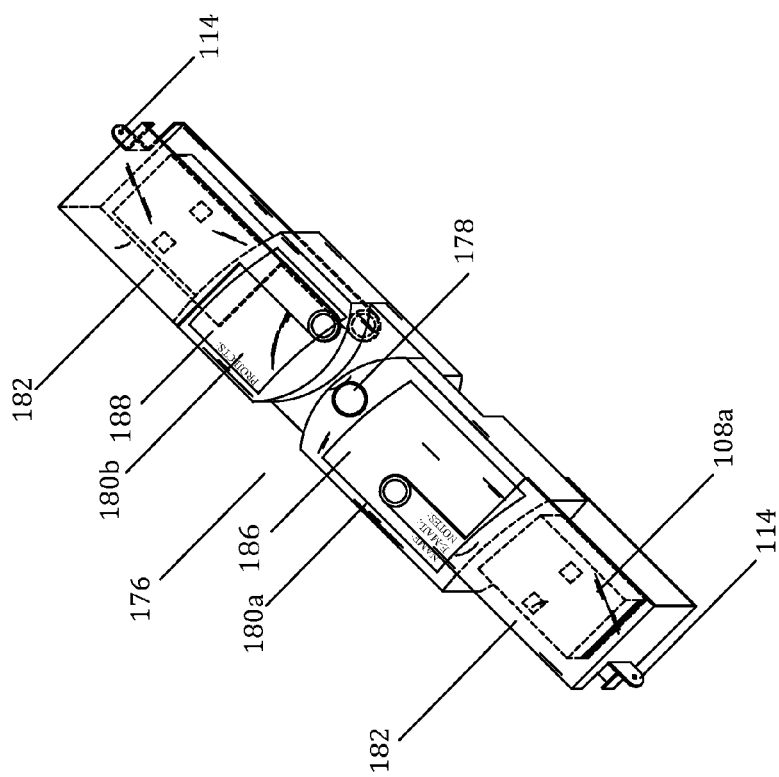

FIG. 79 is a perspective view of the back of the fourth embodiment of the present inventive device.

Figure 80:
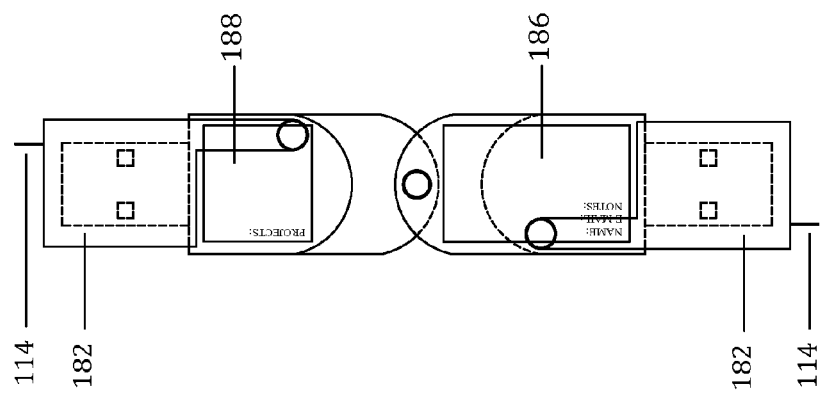

FIG. 80 is an orthographic back view of the fourth embodiment of the present inventive device, showing the note fields that can be filled out or labeled by the owner or user of said inventive device.

FIGS. 81-84 illustrate several variations of the fourth embodiment of the present inventive device, showing examples of various applications and uses that can be made for organizational purposes.

FIG. 85 is an orthographic view of the left side of with a variation of the fourth embodiment, wherein the top USB connector has been replaced with a mini-USB connector or a micro-USB connector, or could even be replaced by a FireWire connector or a Thunderbolt connector, or even a connector for a yet undeveloped data transfer technology.

FIG. 86 is an orthographic front view of the same variation of the fourth embodiment of the present inventive device.

FIG. 87 is a perspective view of the same variation of the fourth embodiment of the present inventive device; said perspective view illustrates as favoring the frontal face view of the device, as well as partially the left side view and the bottom view of the device.

FIG. 88 represents an enlarged but exploded view of the center hinge, and illustrating how the two halves of the present inventive device can be linked together, yet can still rotate independently from each other.

Figure 89:
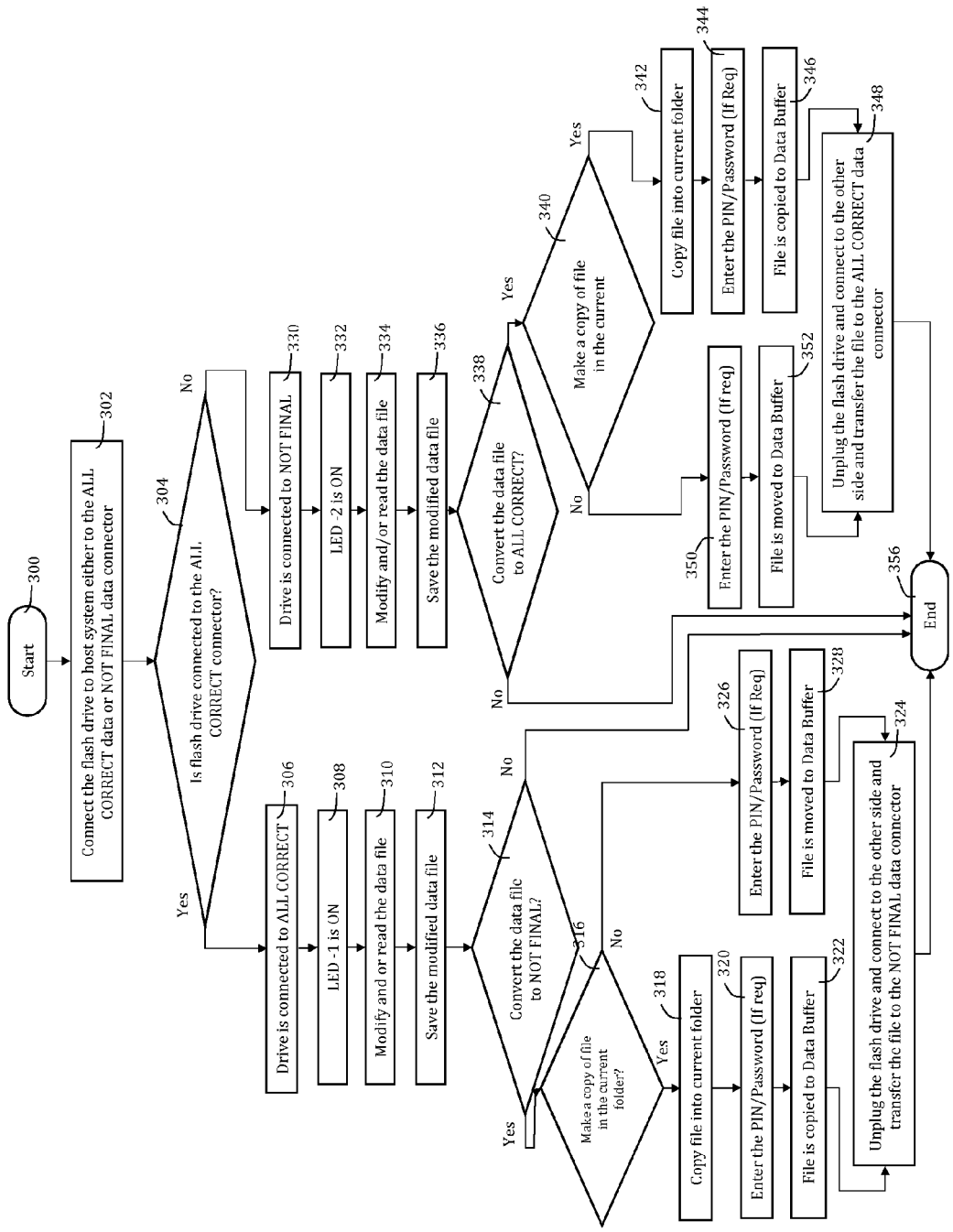

FIG. 89 is a flowchart that describes the steps of a method with various processes involved in the use the present inventive device in a real-life setting.

Figure 90:
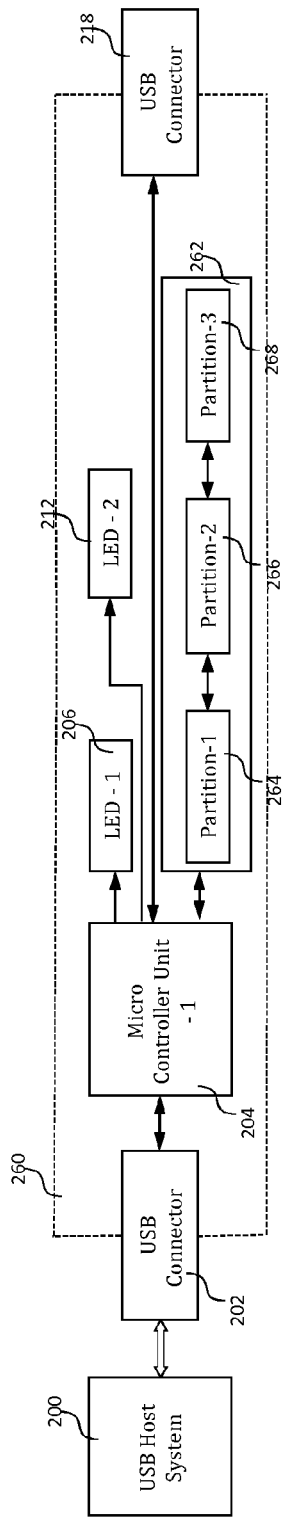

FIG. 90 is a diagram illustrating the various electronic components of the present inventive device's first and second embodiments, when manufactured with only one Micro-Controller Unit (MCU) shared by both halves of the embodiment.

Figure 91:
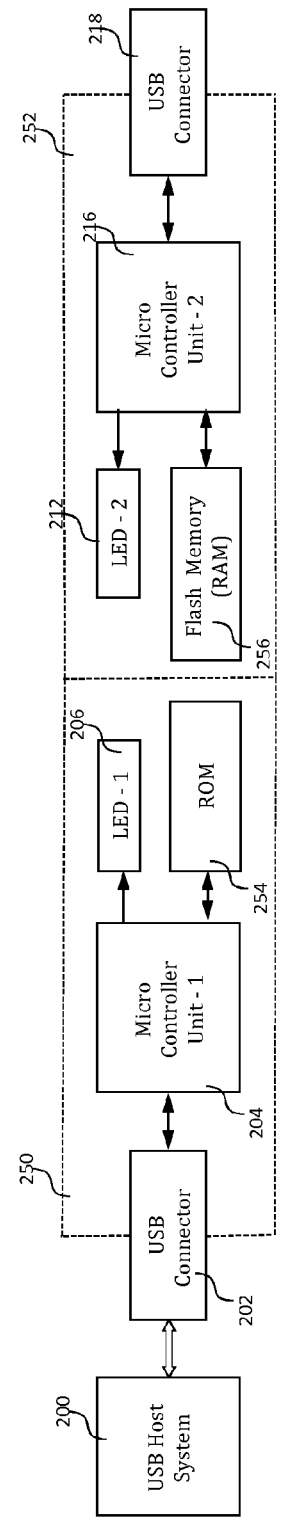

FIG. 91 is an electronic diagram illustrating the relationships between the various components of the present inventive device in its first and second embodiments, when manufactured with two separate and independent Micro-Controller Units (MCU's), and with one Random-Access Memory (RAM) cell and one Read-Only Memory (ROM) cell.

Figure 92:
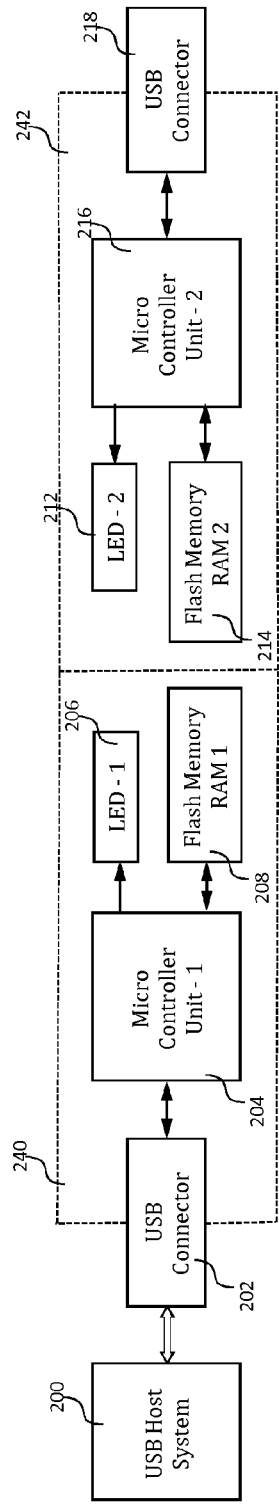

FIG. 92 represents an electronic diagram of the relationships between the various components of the present inventive device in its first and second embodiments when manufactured with two separate and independent MCUs and with two RAM cells.

Figure 93:
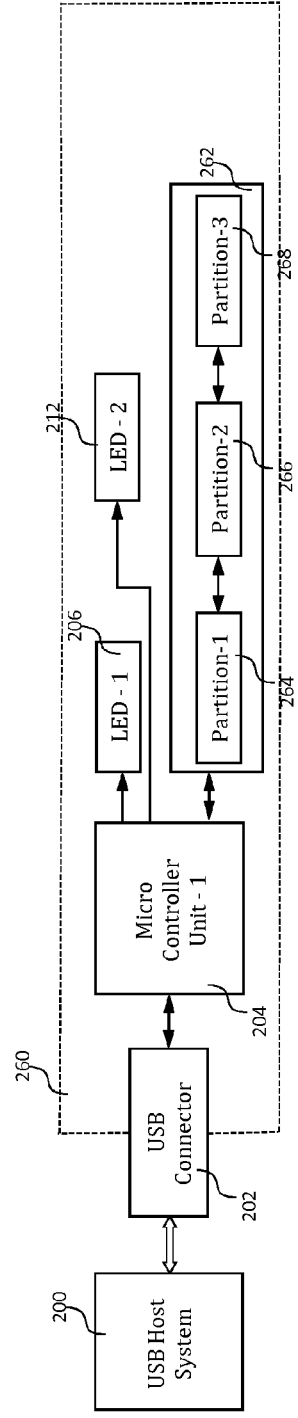

FIG. 93 is a diagram illustrating the various electronic components of the present inventive device's third embodiment, which has only one USB component and therefore only one MCU.

Figure 94A:
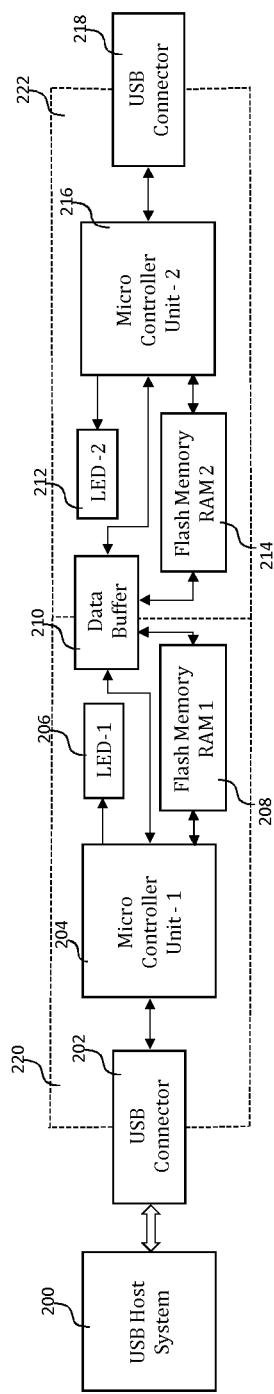

FIG. 94A is an electronic diagram illustrating the relationships between the various components of the present inventive device in its first and second embodiments, when manufactured with two separate and independent MCUs and with two RAM cells that can interact through a Data Buffer.

Figure 94B:
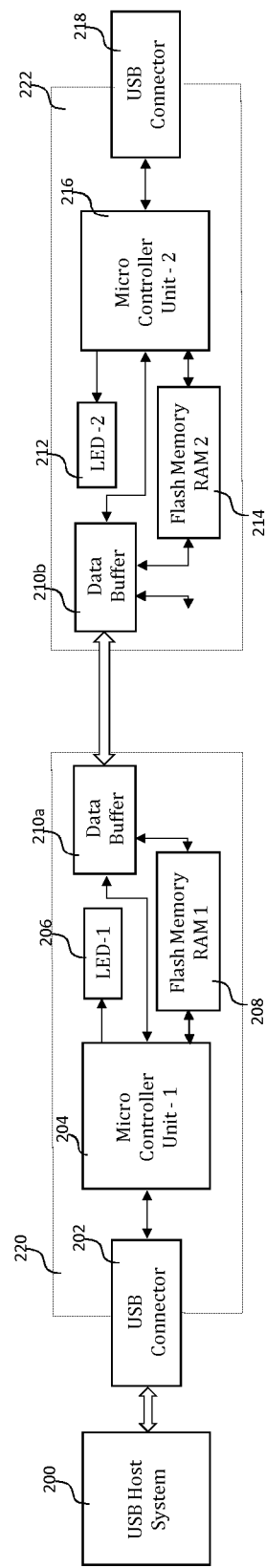

FIG. 94B is an electronic diagram similar to FIG. 94A, however, in this case the two halves are separate entities, yet are still connected, as illustrated for the second embodiment. The electrical connection happens through contacting complementary gold plates on each half that connects when the two halves or sectors are linked together.

FIG. 95A represents an electronic diagram of the relationships between the various components of the present inventive device in its fourth embodiment, with the two halves of the device being structurally separated and each containing separate and independent MCU and RAM cell.

FIG. 95B represents an electronic diagram of the relationships between the various components of the present inventive device in its fifth embodiment. The electronic structure is the same as in its fourth embodiment, with the only change being the USB connector of the second half has been changed to a mini-USB connector or a micro-USB connector, or could even be replaced by a FireWire connector or a Thunderbolt connector, or even a connector for a yet undeveloped data transfer technology, providing greater compatibility.

Figure 96:
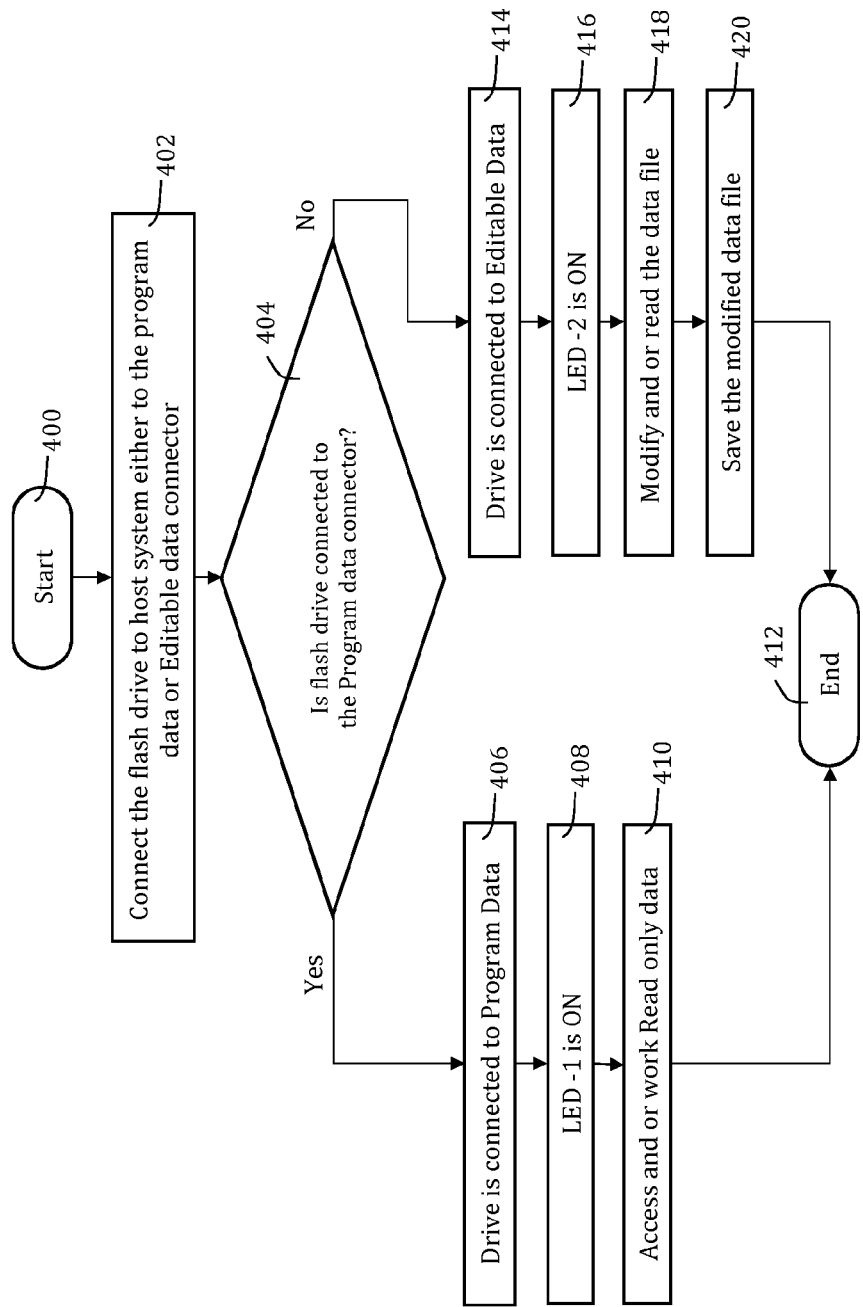

FIG. 96 is a flowchart that describes the steps of a method and the different processes involved in the proper use of the present inventive device in a real-life setting.

IN ORDER TO CLEARLY DESCRIBE THE DETAILS OF THE SPECIFICATION OF THE PRESENT INVENTION, INCLUSIVE OF THE PRESENT INVENTIVE DEVICE, THE FOLLOWING PARTS ARE RESPECTIVELY LABELED WITH THE VARIOUS CORRESPONDING NUMERALS AND ALPHA/NUMERIC REPRESENTATIONS

100—is the first embodiment of the present inventive device and is shown in FIGS. 1, 2, 5, 6, 7, and 10 through 23.
100'—is a variation of the first embodiment of the present inventive device and is shown in FIGS. 24 and 25.
102*a*—is the first half of the first embodiment of the present inventive device and is shown in FIGS. 1, 2, 5, 6, 7, and 10 through 25.
102*b*—is the second half of the first embodiment of the present inventive device and is shown in FIGS. 1, 2, 5, 6, 7, and 10 through 25.
104*a*—is the LED indicator of the first half of the first, third, and fourth embodiments of the present inventive device and is shown in FIGS. 1, 2, 5, 10 through 25, 60, 61, 63, 68 through 73, 74, 77, 78, and 81, 83, 85, 86.
104*b*—is the LED indicator of the second half of the first and fourth embodiments of the present inventive device and is shown in FIGS. 1, 2, 5, 6, 7, 10 through 25, 60, 61, 63, 68, 70, 71, 72, 73, 74, 75, 77, 78, and 81 through 87.
106*a*—is the protruding part of the first half of the first and third embodiments of the present inventive device and is shown in FIGS. 1, 2, 5, 6, 7, 9, 10 through 25, 60, 61, 63, 64, 65, 67, and 68 through 73.
106*b*—is the protruding part of the second half of the first embodiment of the present inventive device and is shown in FIGS. 1, 5, 6, 7, 8, 10, 12, 14, 16, 18, 20, 22 and 24.

108a—is the first USB connector of the various embodiments of the present inventive device and is shown in FIGS. 1, 2, 5, 6, 7, 9, 10 through 23, 26, 27, 27X, 27Y, 29 through 57, 60, 61, 63, 64, 65, 67, 68 through 71, 74, 75, and 77, 78, 79.

108b—is the second USB connector of the various embodiments of the present inventive device and is shown in FIGS. 1, 2, 5, 6, 7, 8, 10 through 25, 26, 27, 27X, 27Y, 29 through 59, 74, 75, and 77, 78, 82, 84, 86, 87.

110a—is the cap of the first half of the first embodiment of the present inventive device and is shown in FIGS. 1, 2, 3, 5, 6, 7, 9, and 10 through 25.

110b—is the cap of the second half of the first embodiment of the present inventive device and is shown in FIGS. 1, 2, 3, 5, 6, 7, 8 plus 6A, and 10 through 25.

112a—is the connection point of the first cap and the first half of the first embodiment of the present inventive device and is shown in FIGS. 1, 2, 5, 6, 7, 6A, and 10 through 25.

112b—is the connection point of the second cap and the second half of the first embodiment of the present inventive device and is shown in FIGS. 1, 2, 5, 6, 7, 6A, and 10 through 25.

114—is the keychain attachment of the various embodiments of the present inventive device and is shown in FIGS. 1, 2, 3, 4, 5, 6, 7, 10 through 25, 60, 61, 62, 63, 64, 65, 68 through 73, 74, 75, 76, 77, 78, 79 through 87.

150—is the second embodiment of the present inventive device and is shown in FIGS. 26, 27, 27X, 27Y, and 29 through 57.

150'—is a variation of the second embodiment of the present inventive device and is shown in FIGS. 58 and 59.

152a—is the first half of the second embodiment of the present inventive device and is shown in FIGS. 26, 27, 29, 30, 31, 33, 34-59.

152b—is the second half of the second embodiment of the present inventive device and is shown in FIGS. 26, 27, and 29, 31, 53-59.

152a'—is a variation of the first half of the second embodiment of the present inventive device and illustrates how the two halves of the present inventive device could be interchangeable. It is shown in FIG. 27X.

152b'—is a variation of the second half of the second embodiment of the present inventive device and illustrates how the two halves of the device could be interchangeable. It is shown in FIG. 27X.

152a"—is another variation of the first half of the second embodiment of the present inventive device and illustrate yet another means of connecting the two halves together. It is shown in FIG. 27Y.

152b"—is another variation of the second half of the second embodiment of the present inventive device and illustrates how the two halves of the device could be interchangeable. It is shown in FIG. 27Y.

154a—is the LED indicator of the first half of the second embodiment of the present inventive device and is shown in FIGS. 26, 27, 27X, 27Y, and 29, 31, 37, 39, 40, 42, 43, 45, 46, 48, 49, 51, 52, 54, 55, 57, 58.

154b—is the LED indicator of the second half of the second embodiment of the present inventive device and is shown in FIGS. 26, 27, 27X, 27Y, and 29, 31, 37, 39, 40, 42, 43, 45, 46, 48, 49, 51, 52, 54, 55, 57, 58.

156a—is the cap of the first half of the second embodiment of the present inventive device and is shown in FIGS. 26, 27, 27X, 27Y, and 29 through 59.

156b—is the cap of the second half of the second embodiment of the present inventive device. It is a mirror image of 156a and is shown in FIGS. 26, 27, 27X, 27Y, 28, and 29 through 59.

158a—is the cap sliding guide of the first half of the second embodiment of the present inventive device and is shown in FIGS. 26, 27, 27X, 27Y, and 29-33, 35, 37-59.

158b—is the cap sliding guide of the second half of the second embodiment of the present inventive device and is shown in FIGS. 26, 27, 27X, 27Y, 28, 29-33, 35, 37-59.

160a—is the guiding groove of the first half of the second embodiment of the present inventive device and is shown in FIGS. 26, 30, 32, 33, 35, 38, 39, 41, 42, 44, 45, 47, 48, 50, 51, 53, 54, 56, 57-59.

160b—is the guiding groove of the second half of the second embodiment of the present inventive device and is shown in FIGS. 26-30, 32, 33, 35, 38, 39, 41, 42, 44, 45, 47, 48, 50, 51, 53, 54, 56, 57, 59.

170—is the third embodiment of the present inventive device and is shown in FIGS. 60, 61, 63, 64, 65, and 68 through 71.

170'—is a variation of the third embodiment of the present inventive device and is shown in FIGS. 72 and 73.

172a—is the first half of the third embodiment of the present inventive device and is shown in FIGS. 60, 61, 63, 64, 65, and 68 through 73.

172b—is the second half of the third embodiment of the present inventive device and is shown in FIGS. 60, 61, 63, 64, 65, 66, and 68 through 73.

174—is the cap of the third embodiment of the present inventive device and is shown in FIGS. 60, 61, 62, 63, 64, 65, 67, and 68 through 73.

176—is the fourth embodiment of the present inventive device and is shown in FIGS. 74, 75, and 77, 78, 79, 81-84.

176'—is a variation of the fourth embodiment of the present inventive device and is shown in FIGS. 85, 86, and 87.

178—is the swivel/detachable junction between the two halves of the fourth embodiment of the present inventive device and is shown in FIGS. 74, 75, 77, 79, 81-84, 86 and 87.

178a—is the protruding part in the first half of the fourth embodiment of the present inventive device that inserts into the second half of the embodiment to create a tightly locked junction of the two halves, (but moveable to the right or to the left, and still can be detached by pushing, thus ensuring the user to be able to fit another second half with a different connector. Said protruding part is shown in FIG. 88.

178b—is the grooved hole in the second half of the fourth embodiment of the present inventive device that snugly connects with the protruding part of the first half of the embodiment to create a fitting junction yet moveable to the right or to the left, and can easily be detached by pushing in order to connect with another first half sector having another connector. Said grooved hole is shown in FIG. 88.

180a—is the first half of the fourth embodiment of the present inventive device and is shown in FIGS. 74, 75, 77, 79, 81-88.

180b—is the second half of the fourth embodiment of the present inventive device and is shown in FIGS. 74, 75, 77, 79, 81-88.

182—is the end cap for both halves 182a and 182b of the fourth embodiment of the present inventive device and is shown in FIGS. 74, 75, 76, and 77 through 87.

184—is the mini-USB connector used in the variations of the various embodiments of the present inventive device and is shown in FIGS. 24, 25, 58, 59, 72, 73, 85, 86, and 87.

186—is the label at the back of the second half 180b of the fourth embodiment 176 of the present inventive device and is shown in FIGS. 79 and 80.

188—is the label at the back of the first half 180*a* of the fourth embodiment 176 of the present inventive device and is shown in FIGS. 79 and 80.

190*a*—is one of the two protruding parts of the first half 152*a*' of the second embodiment of the present inventive device, complete with a gold-plated flat connector and is shown in FIG. 27X.

190*b*—is the other of the two protruding parts of the first half 152*a*' of the second embodiment of the present inventive device, complete with a gold-plated flat connector and is shown in FIG. 27X.

190*a*'—is the protruding part of the first half 152*a*" of the second embodiment of the present inventive device, complete with a gold-plated flat electrical connector, and is shown in FIG. 27Y.

192*a*—is one of the recessed parts of the second half 152*b*' of the second embodiment of the present inventive device, complete with a gold-plated flat electrical connector, that matches the shape of 190*a* in order to offer an optimal electrical connection between the two halves 152*a*' and 152*b*'. Said recessed part is shown in FIG. 27X.

192*b*—is the other of the two recessed parts of the second half 152*b*' of the second embodiment of the present inventive device, complete with a gold-plated flat electrical connector, that matches the shape of 190*b* in order to offer an optimal electrical connection between the two halves 152*a*' and 152*b*'. Said recessed part is shown in FIG. 27X.

192*a*'—is the recessed part of the second half 152*b*" of the second embodiment of the present inventive device, complete with a gold-plated flat electrical connector, that matches the shape of 190*a*' in order to offer an optimal connection between the two halves 152*a*" and 152*b*". Said recessed part is shown in FIG. 27Y.

X—is the junction between both halves of the various embodiments of the present inventive device and is shown in FIGS. 1, 2, 5, 6, 7, 10 through 25, 29-38, 40, 41, 43, 44, 46, 47, 49, 50, 52, 53, 55, 56, 60, 61, 63, 64, 65, 68 through 73, 77 and 86.

DETAILED DESCRIPTIONS AND CLARIFICATIONS AND EXPLANATIONS OF THE ILLUSTRATIVE DRAWINGS OF THE PRESENT INVENTION, INCLUSIVE OF THE PRESENT INVENTIVE METHODS, SYSTEMS AND DEVICE(S)

Figure 1:
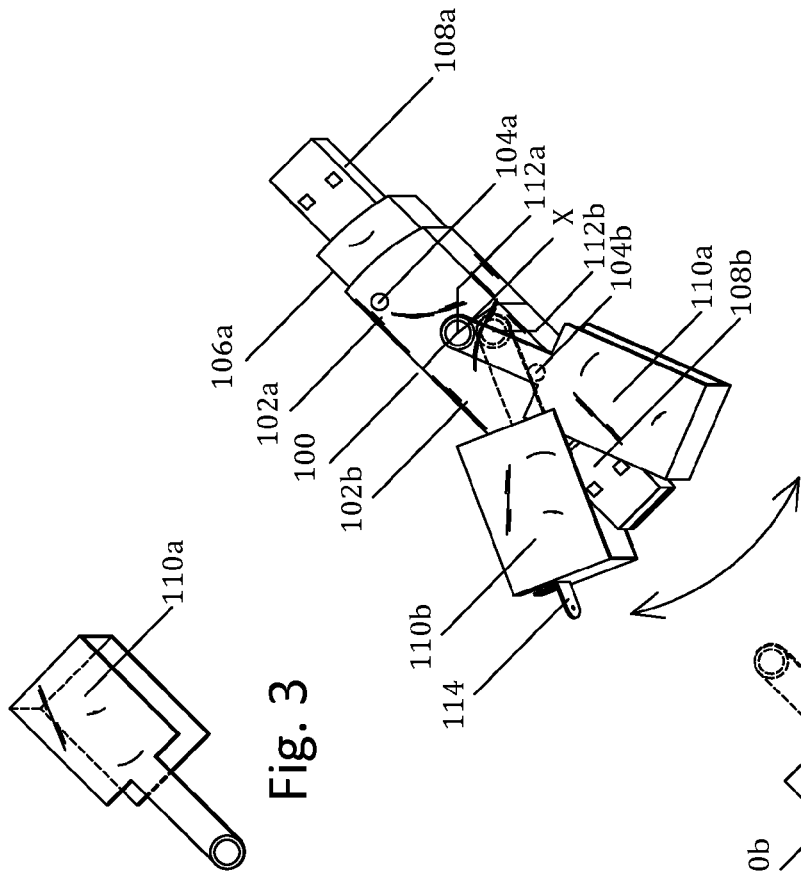
FIG. 1 is the perspective view of the first embodiment of the present inventive device; said perspective view illustrates as favoring the frontal face view and also showing partially the left side view and the bottom view of the same embodiment. It illustrates the first embodiment with the caps over the USB connectors, for protection.

FIG. 1 is a frontal perspective view of the first embodiment 100 of the present inventive device. Said perspective view is favoring the front view and the left side view, as well as the bottom view. It shows the junction X of both halves of the embodiment 100, the halves of the first embodiment 100, respectively shown as 102*a* and 102*b*, the LEDs 104*a* and 104*b*, the protruding ends 106*a* and 106*b*, the USB connectors 108*a* and 108*b*, the caps 110*a* and 110*b* in their closed position, the connection pins for the caps 112*a* and 112*b*, and the keychain attachment 114.

Figure 2:
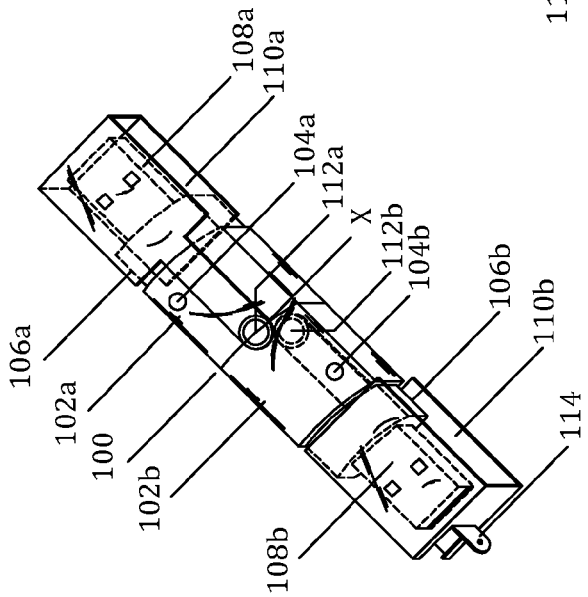
FIG. 2 is another perspective view of the first embodiment of the present inventive device, illustrating the embodiment with the caps being partially superposed, to show the top USB connector open and the bottom USB connector being partially shown. The lids can pivot independently from the center of the present inventive device in order to open both sides of USB connectors.

FIG. 2 is the same perspective view of the first embodiment of the present inventive device as FIG. 1, with the same alpha-numeric labeled elements, however, this time the caps are open. This shows how the top cap must be intentionally smaller than the bottom cap, by a small difference. Since the connection pins 112*a* and 112*b* are independent of each other, the caps can be superimposed, with the bottom cap, containing the keychain attachment, rotating over the top cap.

Figure 3:
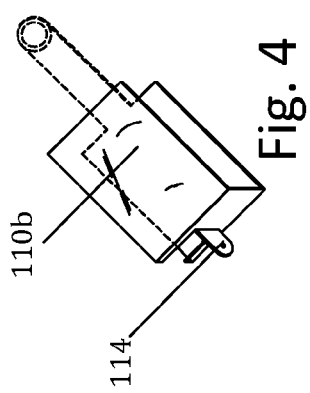
FIG. 3 is a perspective view of the top cap of the first embodiment of the present inventive device; said perspective view illustrates as favoring the frontal face view and partial left side view of the top end cap.

FIG. 3 is a perspective representation of the top cap 110*a* of the first embodiment of the present inventive device.

Figure 4:
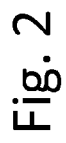
FIG. 4 is a perspective view of the bottom cap of the first embodiment of the present inventive device; said perspective view illustrates as favoring the frontal face view, partial left side view, and bottom view of the bottom end cap.

FIG. 4 is a perspective representation of the bottom cap 110*b* of the first embodiment of the present inventive device. It also shows the keychain attachment 114.

FIGS. 1 to 4 illustrate the various parts of the first embodiment of the present inventive device, especially the top and bottom caps and how they superimpose one over the other when rotating to give access to the USB external connectors.

FIG. 5 is the front view of the first embodiment of the present inventive device, clearly showing the junction X of both halves of the embodiment 100, the halves of the first embodiment 100, respectively shown as 102*a* and 102*b*, the LEDs 104*a* and 104*b*, the protruding ends 106*a* and 106*b*, the USB connectors 108*a* and 108*b*, the caps 110*a* and 110*b* in their covering locked position, the connection pin for the top cap 112*a*, and the keychain attachment 114.

FIG. 6 which is a side view of the first embodiment of the present inventive device, clearly shows the junction X of both halves of the embodiment 100, the halves of the first embodiment 100, respectively 102*a* and 102*b*, the LEDs 104*a* and 104*b*, the protruding ends 106*a* and 106*b*, the USB connectors 108*a* and 108*b*, the caps 110*a* and 110*b* in their closed position, the connection pins for the caps 112*a* and 112*b*, and the keychain attachment 114. FIG. 6A is a detailed side view of the center of the first embodiment of the present inventive device, illustrating how the caps 110*a* and 110*b* securely snap into place using the connection pins 112*a* and 112*b* respectively as guides.

FIG. 7 which is a side view of the first embodiment of the present inventive device, clearly shows the junction X of both halves of the embodiment 100, the halves of the first embodiment 100, respectively 102*a* and 102*b*, the protruding ends 106*a* and 106*b*, the USB connectors 108*a* and 108*b*, the caps 110*a* and 110*b* covering the bottom USB connector, the connection pins 112*a* and 112*b* for the caps, and the keychain attachment 114. It clearly illustrates the small but necessary difference in size between the two caps 110*a* and 110*b* to allow them to superimpose.

FIG. 8 is an end view of the first embodiment of the present inventive device, clearly illustrating the bottom cap 110*b*, the USB connector 108*b*, and the protruding end 106*b*.

FIG. 9 which is an end view of the first embodiment of the present inventive device clearly illustrates the respective cap 110*a*, the USB connector 108*a*, and the protruding end 106*a*.

FIGS. 5 to 9 and illustrate the various parts of the first embodiment of the present inventive device, especially the top and bottom caps and how they superimpose one over the other when rotating to give access to the USB connectors. FIG. 8 shows how the keychain attachment 114 is an integral part of the bottom cap 110*b* and is created by cutting into the cap for the 2 sides of the keychain attachment and bending the third side until it stands perpendicular to the rest of its body. This allows for a simpler, faster, and overall cheaper manufacturing process than adding the keychain attachment by welding it onto the bottom cap 110*b*.

Figure 11:
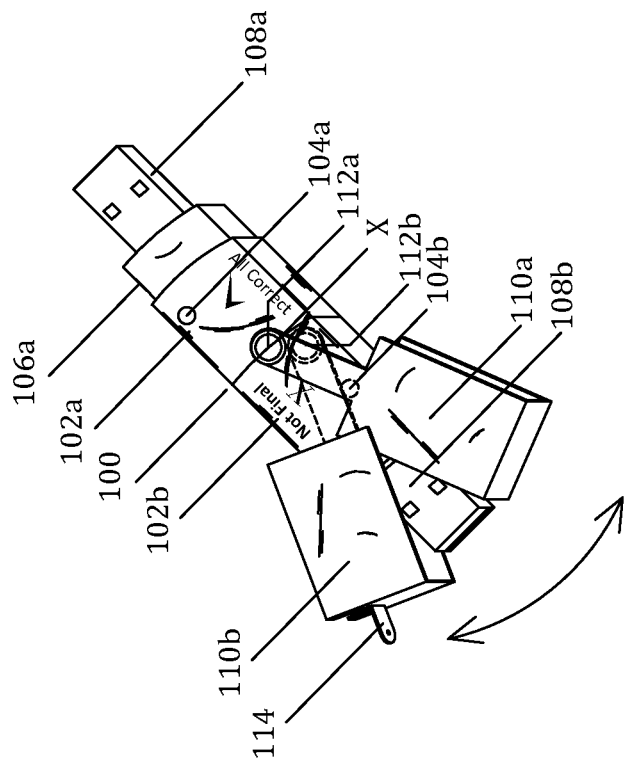
Figure 10:
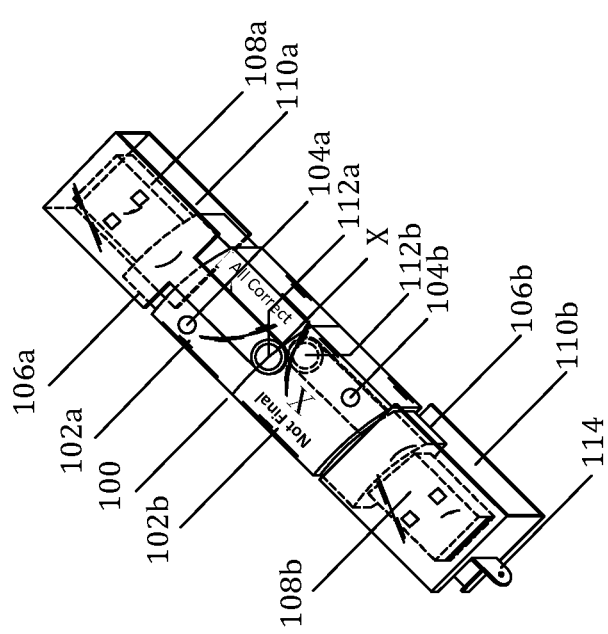

FIGS. 10 and 11 illustrate one of the potential uses of the present inventive device: by separating the two halves physically yet allowing them to be electronically connected, the user could use the present device to store pertinent data/information that is a work in progress. The user would plug in the present inventive device into his/her computer to be able to view and edit the data in the memory of the present inventive device. For example, he/she could plug the device on the "Not Final" half to finish up working on his/her documents, such as a business contract, a design, a presentation, etc. When such document(s) is/are ready to be reviewed or published, he/she can seamlessly transfer the data into the "All Correct" half of the present inventive device. This will allow the user to stay organized in his work and personal life.

FIGS. 12 and 13 represent another potential functionality of the present inventive device by separating Programs from Editable Data. With such a physical separation, the user is able to quickly and easily distinguish and find the application or program he/she is looking for, or alternatively view documents that are stored on the present inventive device. Such a setup could be immensely helpful for IT personnel, amongst others, as they are often required to undertake full deployments of company software and common data for new employees and/or on new equipment and require to both install software and copy documents into the new machine.

Figure 15:
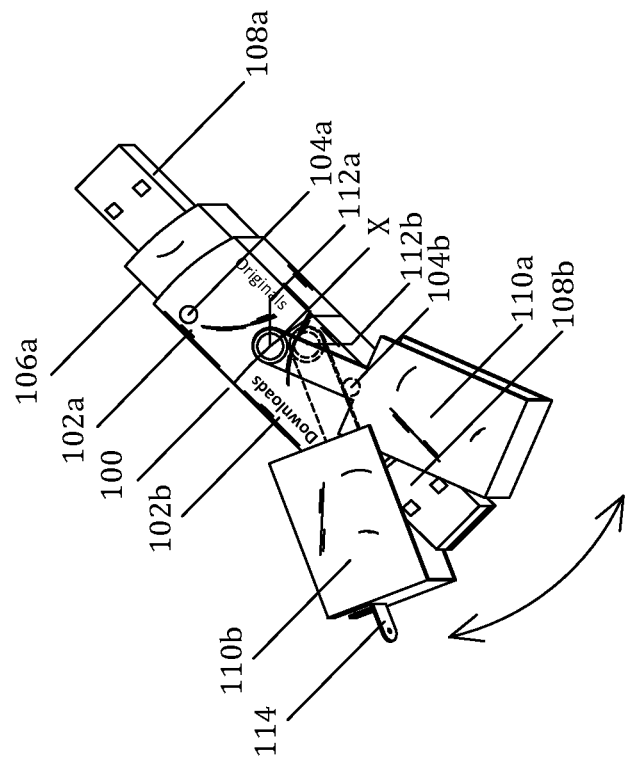
Figure 14:
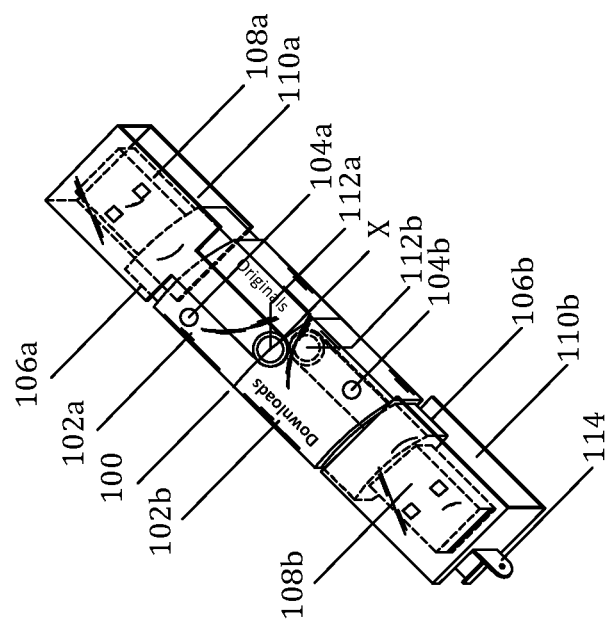

FIGS. 14 and 15 illustrate yet another functional application of the present inventive device: this time, a separation is made between Downloads and Originals. This distinction is quite common in memory storage and has become an unofficial industry standard as it is already applied on various models of external hard drives, network drives and other memory storage devices.

Figure 17:
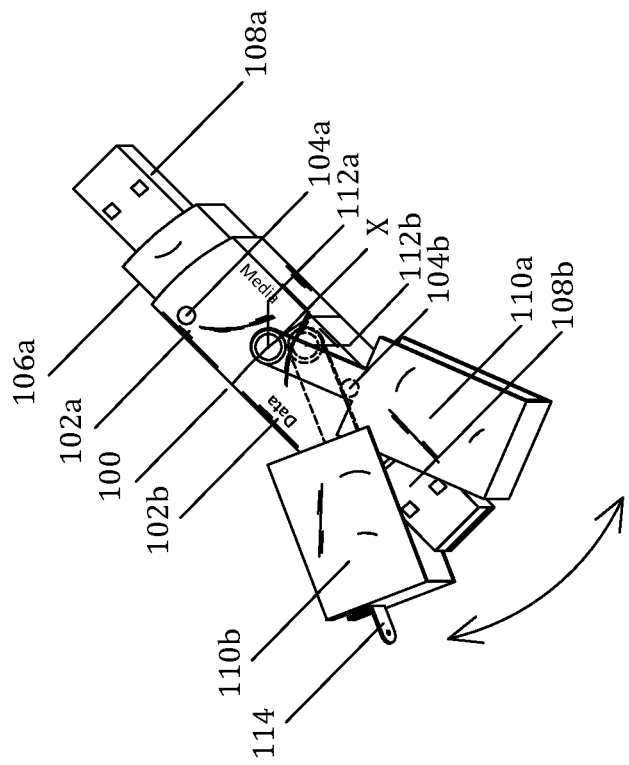
Figure 16:
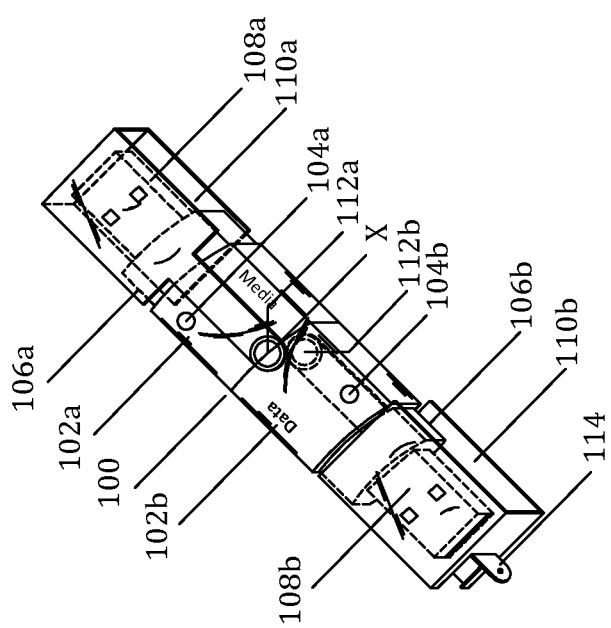

FIGS. 16 and 17 represent a setup that has also become common in the industry, which is to separate Data and Media. As society is increasingly becoming a heavy consumer of all types of media, having a memory storage device as the present inventive device will prevent the user from having to sift through hundreds of media files in order to retrieve the one data file needed at the time.

Figure 19:
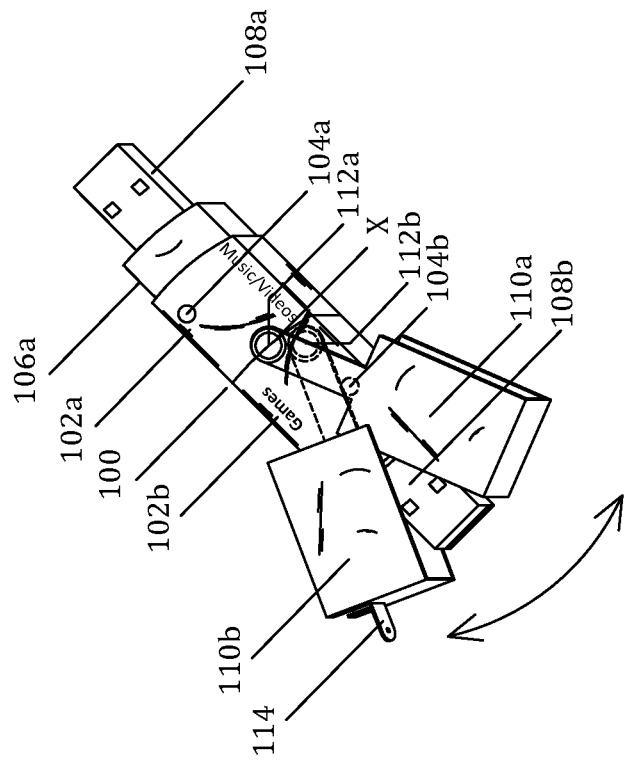
Figure 18:
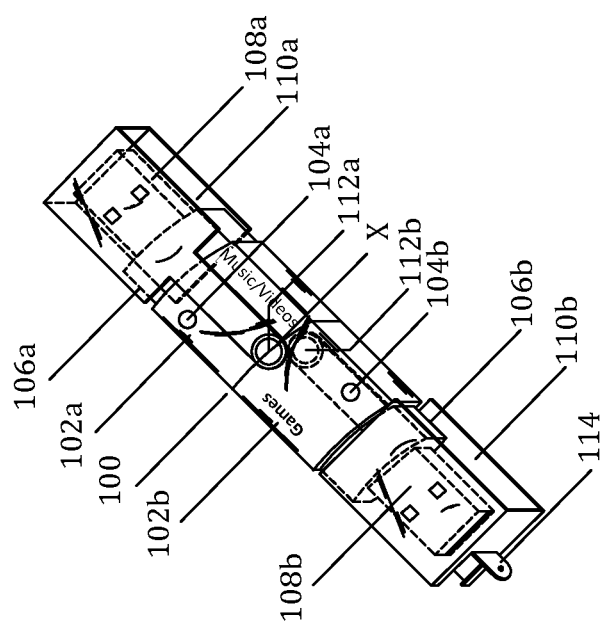

FIGS. 18 and 19 represent yet another version of the first embodiment of the present inventive device used for organizational purposes. In this instance, the Hy-Brex device is separating Games from Music and Video files, which would be an organizational feature probably popular for the youth.

Figure 21:
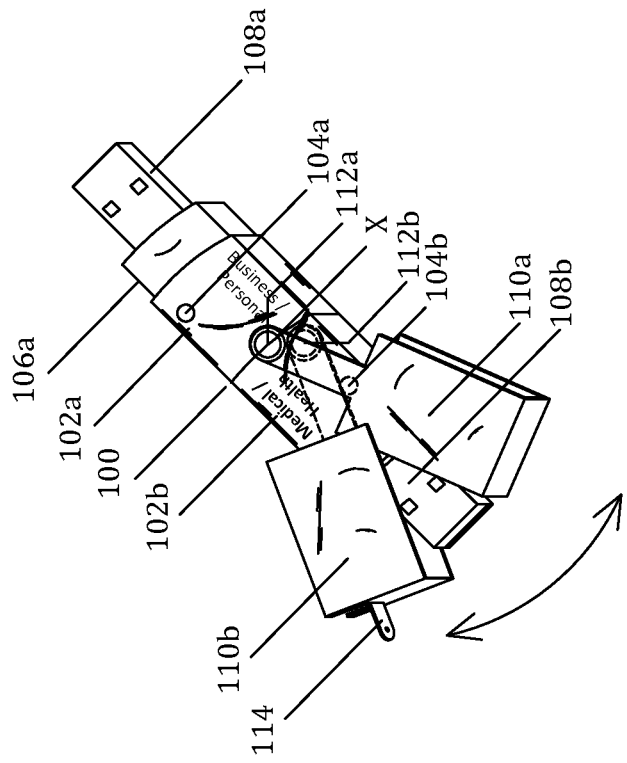
Figure 20:
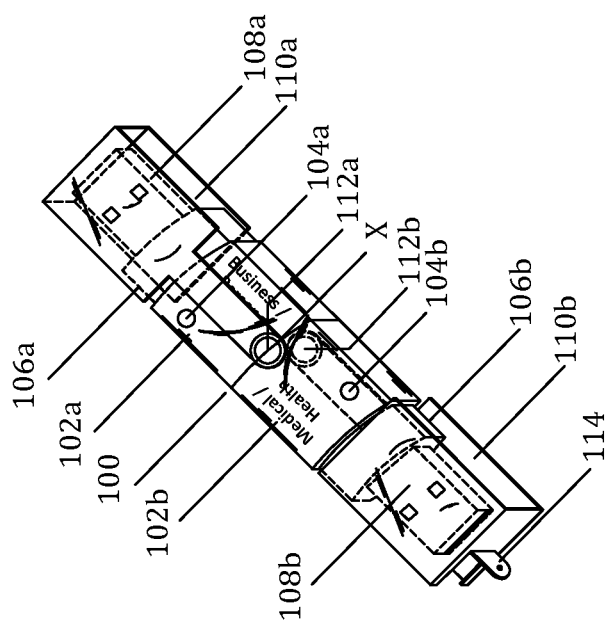

In contrast, FIGS. 20 and 21 illustrate a functional application more suited for adults, more precisely for business men and women, as it separates Business and/or Personal data from Medical/Health document files.

FIGS. 22 and 23 illustrate how the compartmentalization of the memories can be used to separate contacts so as to be able to quickly retrieve contact information of a person, be it a friend, family member, or another important contact.

FIGS. 24 and 25 represent a variation 100' of the first embodiment 100 of the present inventive device. In this variation, the USB connection of the first half 102a has been replaced by a mini-USB connector 184. Another variation could be to have a micro-USB connector instead, or could even be replaced by a FireWire connector or a Thunderbolt connector, or even a connector for a yet undeveloped data transfer technology. These potential variations provide greater compatibility with existing devices, thus allowing a wider use of this present inventive device.

FIGS. 26 and 27 clearly illustrate the second embodiment of the present inventive device. In this embodiment, the end caps 156a and 156b do not rotate, but rather slide up and down the first and second halves 152a and 152b of the second embodiment of the present inventive device. The end caps 156a and 156b are able to slide up and down due to a recess 160a and 160b on each half 152a and 152b of the device, in which a protruding guide 158a and 158b that is directly attached to the end cap 156a and 156b smoothly glides.

FIG. 27X illustrates a variation of the second embodiment of the present inventive device, wherein the two halves of the said device can be separated and are interchangeable with other available desired halves with various selected connectors, including but not limited to mini-USB, micro-USB, FireWire 400, FireWire 800, and Thunderbolt, allowing the users to mix and match halves to create a coordinated organized device with high compatibility according to his/her needs. The two halves are connected through protrusions 190a and 190b and recesses 192a and 192b on compatible corresponding halves, creating a "male/female" structural connection. In addition, each protrusion and recess has a gold-plate electrical connector or other electrical connector that creates an operable optimal electrical connection, allowing acceptable communication and data transfer between the two integrated halves.

FIG. 27Y represents another means of structural connection between the two halves of the second embodiment of the present inventive device. It is similar to the principle described above for FIG. 27X, however in this variation only one protrusion 190a' is required and runs through the entire width of the first half 152a". Thus, only one recess 192a' is required on the second half 152b" in order to complete the structural connection between the two halves. The gold-plated electrical connectors or other electrical conductive connectors are also present in this case to create also an optimal operable electrical connection between the two halves to allow acceptable communication and data transfer between the two integrated halves.

FIG. 28 clearly illustrates said end caps 156a and 156b, which are identical in structure and shape but are mirror images of each other and can include different color for organizational purposes. It illustrates once more the guides 158a and 158b that are attached to the end caps to allow them to slide up and down to lock and cover the USB connector and lock and uncover the USB connectors of the said present inventive device.

FIGS. 29 and 30 are orthographic representations of the second embodiment of the present inventive device in its uncovering locked position. FIG. 29 clearly shows a frontal view of the device, illustrating amongst other things the round notch in the end caps 156a and 156b to allow the user to view the LED indicators 154a and 154b to always be aware of the device's status. FIG. 30 shows a side view of the same second embodiment of the present inventive device, which illustrates amongst other things the junction X between both halves 152a and 152b of the second embodiment 150 of the present inventive device.

FIGS. 31 and 32 are orthographic representations of the second embodiment of the present inventive device and show the present inventive device in its covering locked position. FIG. 31 clearly shows a frontal view of the device, illustrating amongst other things how the end caps 156a and 156b are covering the USB connectors 108a and 108b, FIG. 32 is an orthographic representation of the side view of the second embodiment 150 of the present inventive device in its covering locked position, clearly illustrating amongst other things the guide and recess mechanism that stop the end caps 156a and 156b from completely sliding out thanks to the protruding guides 158a and 158b hitting the end of the recesses 160a and 160b.

FIGS. 33 through 36 are orthographic longitudinal cross-sections of the second embodiment 150 of the present inventive device and clearly illustrate that they are respectively in their uncovering locked and covering locked positions, and clearly showing in yet greater detail the functioning of the guide and recess mechanism in this second embodiment.

FIGS. 37 through 57 are representations of the different examples of usage of the present inventive device in its second embodiment. The examples used here are the same as the examples for potential uses of the present inventive device in its first embodiment described further in the above explanations. The examples listed are not the only potential uses of the present inventive device, as many more categories and specifications can be created for organizational purposes of the present invention.

In FIGS. 58 and 59, a variation 150' of the second embodiment 150 is illustrated. It shows the USB connector of the first half 152a has been replaced by a mini-USB connection 184. The mini-USB connector 184 could also be replaced by a micro-USB connector, or could even be replaced by a FireWire connector or a Thunderbolt connector, or even a connector for a yet undeveloped data transfer technology in other variations of the second embodiment of the present inventive device, providing a greater compatibility with a larger number of devices.

FIGS. 60 and 61 illustrate a third embodiment 170 of the present inventive device. In this embodiment, there is only one USB connector 108a to access the data on both halves 172a and 172b of this said third embodiment. The end cap 174 is a swinging cap similar to that of the first embodiment of the present inventive device; however, in this instance the cap is connected to the main body 170 both at the front and back of the device. The LED indicators 104a and 104b in this particular embodiment are off-centered in order to also allow for constant monitoring of the status of the present inventive device by the user.

FIG. 62 represents a detailed perspective view of the end cap 174, also showing the keychain attachment 114 as previously illustrated in the end cap 110b of the first embodiment 100.

FIGS. 63 through 66 are orthographic representations of the third embodiment 170 of the present inventive device. FIG. 63 is the front view of said third embodiment, clearly showing the junction X of both halves of the embodiment 170, the halves of the third embodiment 170, respectively 172a and 172b, the LED indicators 104a and 104b, the protruding end 106a, the USB connector 108a, and the end cap 174 in its covering position, complete with the keychain attachment 114.

FIG. 64 which is a side view of the third embodiment of the present inventive device, clearly shows the junction X of both halves of the embodiment 170, the halves of the third embodiment 170, respectively 172a and 172b, the LED indicators, the protruding end 106a, the USB connector 108a, and the end cap 174 in its covering position, complete with the keychain attachment 114.

FIG. 65 which is a side view of the third embodiment of the present inventive device, clearly shows the junction X of both halves of the embodiment 170, the halves of the third embodiment 170, respectively 172a and 172b, the LED indicators 104a and 104b, the protruding end 106a, the USB connector 108a, and the end cap 174 in its uncovering position, complete with the keychain attachment 114.

FIG. 66 is a bottom view of the third embodiment of the present inventive device, illustrating the second half 172b of the third embodiment 170.

Figure 68:
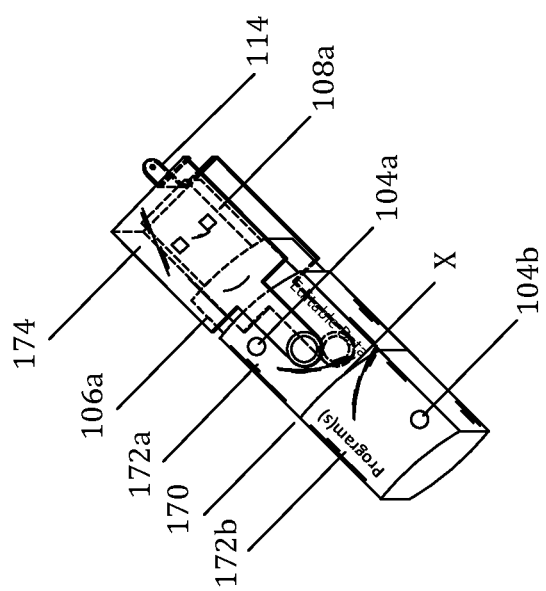

FIG. 67 which is a top view of the third embodiment of the present inventive device clearly illustrates the end cap 174, the USB connector 108a, and the protruding end 106a. FIGS. 68 and 69, as well as FIGS. 70 and 71, clearly illustrate also two of the potential uses of the present inventive device, as described further above for the first embodiment.

FIGS. 72 and 73 illustrate a variation 170' of the third embodiment 170, in which the USB connector has been replaced by a mini-USB connection 184. The mini-USB connector could also be replaced with a micro-USB connector, or could even be replaced by a FireWire connector or a Thunderbolt connector, or even a connector for a yet undeveloped data transfer technology in variations of the said third embodiment.

FIGS. 74 and 75 illustrate the fourth embodiment 176 of the present inventive device, which has a USB connector 108a and 108b on each of its respective halves 180a and 180b, an end cap 182 on both halves with an off-center rotation axis and a keychain attachment 114, centered LED indicators 104a and 104b, and most importantly, a swivel axis 178 that allows both halves of the device in this fourth embodiment to partially rotate independently.

FIGS. 76 illustrates a perspective view of the end cap 182, showing the keychain attachment 114.

FIGS. 77 and 78 are orthographic representations of the fourth embodiment 176 of the present inventive device. FIG. 77 is a frontal view of the device, while FIG. 78 is a side view, illustrating how the swivel mechanism works.

FIGS. 79 and 80 illustrate the back of the fourth embodiment 176 of the present inventive device, which reveals label 186 on the first half 180a, and label 188 on the second half 180b of the fourth embodiment. These labels 186 and 188 allow the user to write down information about himself/herself in case the device is lost, so that it can be brought back to its rightful owner, and also some specific information about the type of data or contents stored in the device.

Figure 84:
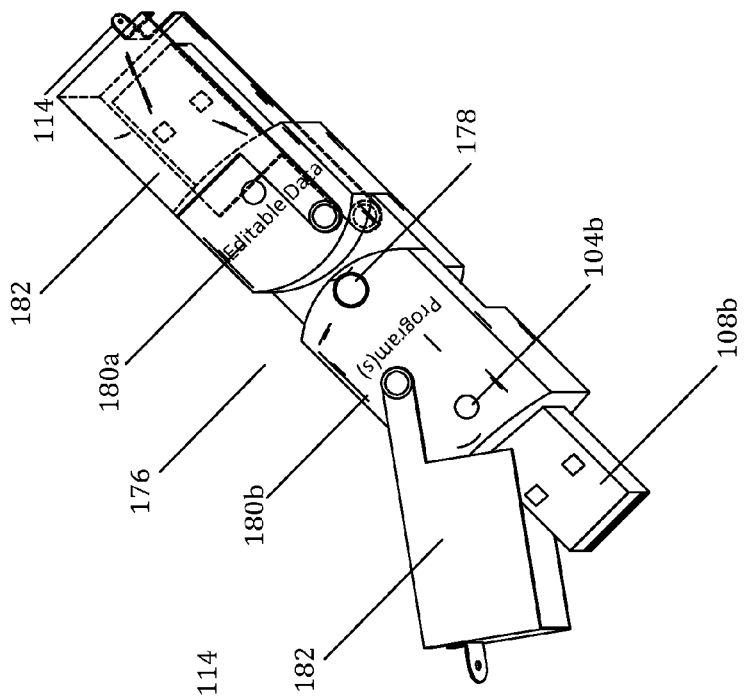
Figure 83:
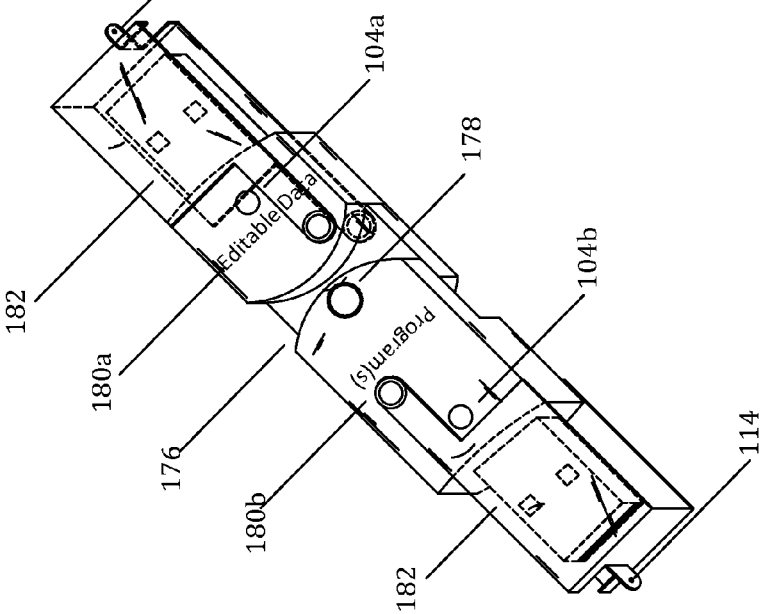

FIGS. 81 and 82, as well as FIGS. 83 and 84 illustrate also two of the potential uses of the present inventive device, as described further above for the first embodiment.

FIGS. 85 to 87 illustrate a variation 176' of the fourth embodiment 176, replacing the USB connector of the first half 180a with a mini-USB connector 184 for greater compatibility with other devices, computers, laptops, etc. The mini-USB connector could also be replaced by a micro-USB connector, or could even be replaced by a FireWire connector or a Thunderbolt connector, or even a connector for a yet undeveloped data transfer technology.

FIG. 88 illustrates how the swivel 178 between the two halves 180a and 180b is made: a protruding part 178a is located on the first half 180a, while a matching hole 178b is located on the second half 180b of the fourth embodiment of the present inventive device. Both the protrusion and the hole are grooved to allow the two halves to snap into place and not dislodge from one another during use of the device. The connection between the two halves is purely structural and rotatable or swingable, with no electrical connection, which implies that the two halves of the device cannot communicate.

FIG. 89 is a flowchart illustrating an example of one method or process that takes place when the present inventive device is plugged into a host system (computer, laptop, netbook, etc. . . . ). In this example, the embodiment used has two USB interface connectors, adapted in either the first, second, or fourth embodiment as described earlier in this present patent application, and said embodiments having the labels "ALL CORRECT" and "NOT FINAL" on their first and second halves, respectively. The process starts from Step 300, then, the user/owner connects the present inventive device to the host system on either the "ALL CORRECT" color-coded half sector or the "NOT FINAL" color-coded half sector of said device in Step 302. Step 304 is an internal check to see which color-coded half sector of said device is really connected. If the device is connected to the first color-coded half sector (ALL CORRECT), the process continues to Step 306, then to Step 308 which turns on the LED-1 of said device to indicate its respective color-coded half is in use. In Step 310, the user modifies and reads the desired files, then saves the modified file in Step 312. A choice is then offered to the user in Step 314 to convert the modified file to NOT FINAL. If the user chooses No, the process ends in Step 356 which means that the modified file still remains in the "ALL CORRECT" color-coded half sector, then ends.

If the user chooses Yes in Step 314 to convert the modified data to NOT FINAL, then, in Step 316 the user is asked to make a copy of the modified file in the current folder, then, if Yes, copying the modified NOT FINAL data file in the current folder in Step 318, and then in Step 320, entering the PIN, if required, then copying of the modified NOT FINAL data file to the Data Buffer in Step 322, and then in Step 324, unplugging the flash drive organizer device and connecting it to the other color-coded half sector through the respective USB connector and transferring the modified file to the NOT FINAL data color-coded half sector, then, the process ends in Step 356.

If deciding No to make a copy of the converted modified NOT FINAL data file In Step 316, then after entering the PIN or password, if required in Step 326, then moving the converted modified NOT FINAL data file to the Data Buffer in Step 328, then in Step 324 unplugging the flash drive organizer device and connecting it to the other color-coded half sector through the respective USB connector and transferring the modified data file to the NOT FINAL color-coded half sector, then, the process ends in Step 356.

If the ALL CORRECT color-coded half sector of the present inventive device is not connected to the USB host system in Step 304, then the present inventive device is connected to the NOT FINAL color-coded half sector as established in Step 330. Step 332 turns On the LED-2 of said device to indicate its respective color-coded half sectors in use. In Step 334, the user modifies and/or reads the desired files, then saves the modified data in Step 336. A new choice is then offered to the user in Step 338 whether to convert the modified file to ALL CORRECT color-coded half sector. If the user chooses No, then the process ends in Step 356.

If in Step 338, the answer is Yes, then in Step 340, the user is asked to make a copy of the file in the current folder, then if the answer is Yes in Step 340, then in Step 342 copying the file into the current folder, then entering the PIN/PASSWORD, if required in Step 344, then in Step 346, copying the file to the Data Buffer, then in Step 348, unplugging the flash drive and connecting the respective USB connector to the host system and transferring the file to the ALL CORRECT color-coded half sector of said device, then the process ends in Step 356.

If in Step 340, the answer is No, then, in Step 350, entering the PIN/PASSWORD, if required, then in Step 352 the file is moved to the Data Buffer, then in Step 348 unplugging the present inventive device and then plugging the other color-coded half sector of said device to the USB host system to transfer the file to the ALL CORRECT color-coded half sector of said device. The process then ends in Step 356.

In FIG. 90 is illustrated the various main electronic components of the present inventive device in its first and second embodiments with two USB connectors in this instance, when manufactured with only one Micro-Controller Unit (MCU). The device 260 is connected to the USB host system 200 (computer, laptop, netbook, TV, etc) through the USB connector 202 of the first half, or the USB connector 218 of the second half of the embodiment. Both USB connectors are connected to the Micro-Controller Unit 1 (204), which handles the communications with the USB Host System 200. The MCU is also connected to LED 1 (206) of the first half, and LED 2 (212) of the second half of the embodiment. When USB connector 202 is connected, LED 1 is lit to indicate that the first half of the embodiment is active. When USB connector 218 is connected, LED 2 is lit to indicate that the second half of the embodiment is active. The MCU is also connected to the RAM 262 of the device, which is divided into three partitions 264, 266, and 268. This allows the user to select which RAM partition to use to save files by classifying them in order to retrieve the exact file needed more quickly when looking for it.

In FIG. 91 is represented an electronic diagram showing the electronic linkages between the components of the present inventive device in its first and second embodiments with two USB connectors in this instance, and this time manufactured with two separate and independent MCU's. The first half 250 of the device connects to the USB Hosts System 200 (computer, laptop, netbook, TV, etc) using the USB connector 202. This said half contains a MCU 204, which controls the communications with the USB Host System 200 and is linked to the LED 1 (206) to indicate when this half is currently being accessed by the USB Host System 200. The MCU 204 is also linked to a Read-Only Memory (ROM) cell 254, which contains various programs and applications stored by the current owner/user or by the manufacturer. These programs and applications could be but are not limited to hardware drivers, purchased software, bootable disk, etc. The second half 252 of the device is composed of an MCU 216, an LED 2 (212), and a RAM 256. The MCU 216 and LED 212 have the same functions and capabilities as those of the first half 250, with the only difference being that the MCU 216 is not connected to a ROM, but to a RAM (256), allowing the owner/user of the device to read, write, and edit the documents stored in said RAM 256 of the second half 252 of the device.

In FIG. 92 is illustrated yet another variant of the electronic structure of the first and second embodiments of the present inventive device with two USB connectors in this instance, and with this time both halves 240 and 242 being identically structured electronically. The halves connect to the USB Host System 200 via the USB connectors 202 and 218, with all the communications being handled by the first half's MCU 204 and by the second halts MCU 216, respectively. Both MCU's are connected to their own LED indicators (206 for LED 1 and 212 for LED 2), and to their own, independent RAM cells (208 and 214 respectively). This provides the user/owner with a choice of storage to keep all of his/her data organized and separated for easier access and faster retrieval and/or display.

In FIG. 93 is shown a diagram illustrating the linkage between the electronic components of the device in its third embodiment, which has only one interface connector, in this instance a USB connector. The device 260 connects to the USB Host System 200 through its only USB connector 202, which is linked to the MCU 204 that handles all communications with the USB Host System 200. Although there is only one USB connector 202, the device still possesses two LEDs 206 and 212, respectively, which are linked to the MCU 204 and indicate to the owner/user which part of the RAM cell 262 is being accessed. The RAM cell 262 is divided into three partitions 264, 266, and 268 for the owner/user to categorize his/her data/information in the respective partition for a faster retrieval and/or display of the desired data/information at some later date(s).

In FIG. 94A is represented another variant of the electronic structure of the first and second embodiments of the present inventive device with two USB connectors in this instance. Similar to FIG. 92, the two halves 220 and 222 each contain their own USB connectors 202 and 218 to connect to the USB Host System 200, their own respective MCU 204 and 216 to handle all communications between the components, their own respective LED indicator 206 and 212 to indicate which half is currently active (i.e. being read or displayed or written into), and their own respective RAM 208 and 214 to store the data/information or retrieve or display the data/information from. However, in this case, the RAMs are connected to a Data Buffer 210 to allow data/information to be transferred between the two halves of the same embodiment, for example, in the case of a draft becoming the complete and final version of a document.

FIG. 94B represents the final variant of the electronic structure of the second embodiment of the present inventive device with two USB connectors in this instance, illustrating the case when the two halves of the device are interchangeable. In this instance, the two halves 220 and 222 each contain their own USB connectors 202 and 218 to connect to the USB Host System 200, their own respective MCU 204 and 216 to handle all communications between the respective components, their own respective LED indicator 206 and 212 to indicate which half is currently active (i.e. being read or displayed or written into), their own respective RAM 208 and 214 to store the data/information or retrieve or display the data/information from, and their own data buffer 210a and 210b. The information is contained in each data buffer for their respective halves, and when the two halves are connected, the gold-plated electrical connectors connect the two data buffers, allowing the MCU of either half to access both buffers, thus allowing communication and transfer of data/information.

FIG. 95A represents an electronic diagram showing the electronic linkages between the various components of the present inventive device in its fourth embodiment with two USB connectors in this instance, wherein the two halves of the device are completely independent from each other. The device is connected to the USB host system 200 through the USB connector 202 of the first half 220, or the USB connector 218 of the second half 222. If connected to the first half, the MCU-1 204 that is connected to the USB host 200 through the USB connector 202 will turn on the LED-1 206 and will communicate with the flash memory RAM-1 208. If the device is connected to the USB host 200 through the USB connector 218, the MCU-2 labeled 216 will turn on the LED-2 labeled 212 and will communicate with the flash memory RAM-2 labeled 214.

FIG. 95B is similar in numbering and components to FIG. 95A as it illustrates the electronic components and their relations of the same fourth embodiment of the present inventive device. However, in this FIG. 95B, the fourth embodiment is in its variation with a mini-USB connector 224 replacing the standard USB connector in the present inventive device's second half 222. The mini-USB connector 224 could also be replaced by a micro-USB connector, or could even be replaced by a FireWire connector or a Thunderbolt connector, or even a connector for a yet undeveloped data transfer technology for yet other variations of the embodiment and the present inventive device in general.

In FIG. 96 is represented a flowchart that illustrates the process that takes place when one of the halves of the present inventive device is setup as read-only, for example when having Editable Data in one half and Program Data in the other, which prevents transfer of data from one side to the other. The process starts at Step 400, then the user plugs in the present inventive device into a host system in Step 402 either through the Program Data or through the Editable Data connector. Step 404 checks which half the device is connected to the host system. If the flash drive is connected to the Program Data half of the device in Step 406, the LED-1 will be turned on to indicate this half is in use in Step 408, and the user may access the read-only data in Step 410. The process then ends in Step 412.

If the drive is connected to the Editable Data half of the device established in Step 414, then the LED-2 will be turned on to indicate this half is in use in Step 416, and the user may access, modify, read, or display the files in memory in Step 418. Once the data is saved in Step 420, the process ends in Step 412.

It is to be clarified and understood that the present invention is not limited to the shown embodiments, descriptions, illustrations, explanations, drawings, diagrams, flowcharts and alpha-numeric representations of the illustrated parts and figures, and that other modifications and ramifications are possible as long as they are within the spirit and scope of the inventions as claimed.

I, the present inventor of the present invention claim:

1. A practical multi-purpose flash drive organizer device comprising of a combination of:
   (a) color-coded sectors of a housing of said device configured to facilitate in aiding the user to choose which particular sector of said device is to be activated;
   (b) at least one USB connector in the respective sector for electrically connecting and linking with a host computer system linked to a compatible monitor;
   (c) at least one LED signal activity light, located externally of said housing, configured to turn on when the respective sector of said device is electrically linked and activated with the host system;
   (d) at least one microprocessor in said device for processing data and information when actively electrically linked with a host system;
   (e) at least one ROM incorporated within said device configured for storing and retrieving at least one program when actively electrically linked with a host system;
   (f) at least one RAM in said device configured for storing, editing, updating, deleting, displaying, transferring and exchanging data/information when actively electrically linked with a host system;
   (g) at least one cap configured for covering the respective USB connector or connectors of said device; and
   (h) at least one external labeling area configured for easily writing and identifying data/information contents within said device.

2. A device as claimed in claim 1, wherein the designated color-coded sectors of said housing are differentiated by certain colors for specific color-coding; said sectors of said housing capable of being detached from each other, and, then also capable of being reconnected again and electrically linked to each other again to allow a variety of combinations of USB connectors, when at least two compatible USB connectors are needed by the user of said device.

3. A device as claimed in claim 1, wherein the color-coded sectors of said housing are structurally of uni-body type and completely joined, but have separate internal components that are not linked to each other, having separate USB connectors at each end of each of the respective color-coded sectors.

4. A device as claimed in claim 1, wherein between the respective color-coded sectors there is a common data/information buffer to allow the transfer and exchange of data/information between said color-coded sectors.

5. A device as claimed in claim 1, wherein, within the internal portions of the color-coded sectors there is a plurality of microprocessors for operating said device.

6. A device as claimed in claim 1, wherein between the at least two color-coded sectors there is one common microprocessor for operating said device.

7. A device as claimed in claim 1, wherein within an internal portion of each color-coded sector there are two separate but communicating RAMs.

8. A device as claimed in claim 7, wherein within the internal portion of the color-coded sectors there are at least two partitioned memory RAM cells.

9. A device as claimed in claim 1, wherein within each of the color-coded sectors there is only one ROM for storing and operating the program files when actively electrically linked with a compatible host system.

10. A device according to claim 2, wherein there is further comprising a pair of complementing electrically conductive plates or points to allow the exchange of data/information between the linkable color-coded sectors.

11. A flash drive organizer device having easily distinguishable external color-coded sectors of the housing wherein the colored-coded sectors having at least one electrical USB connectors capable of being plugged into a corresponding compatible computer USB interface of a host computer system, are configured to identify which sector is to be activated, so as to enable the user of said device to easily utilize certain definite desired selection or selections of data/information stored within the memory or memories of said device and outputted from said device, as well as inputted into said device through the connected corresponding host computer system and linked compatible monitor wherein said device is electrically connected.

12. A device as claimed in claim 11 having one visible external LED activity light indicator.

13. A device as claimed in claim 11, wherein said device is provided with one or more linked visible external LEDs activity light indicators.

14. A device as claimed in claim 11, wherein the color-coded sectors of said housing are unitary in structure, having only one common housing, one USB interface connector and one swingable cover for the USB interface connector.

15. A device as claimed in claim 11, wherein the internal electronic components within said device have one or several intercommunicating RAMs or writeable or rewriteable flash memory partitioned cells.

16. A device according to claim 11 having at least one or several micro-processors.

17. A device as claimed in claim 11, wherein said external color-coded sectors of said housing being provided with external electrical interface components at each of the respective color-coded sector ends, and, also being provided with labeling areas for the user to use for better convenient organizational labeling of relevant respective contents in any language or symbols to well designate the desired data/information to achieve better organized file recognition during work performance using said multi-purpose flash drive organizer device.

18. A device of claim 11, wherein there is provided at least one color-coded cover or covers for the corresponding external electrical USB interface connectors; said color-coded cover or covers having available labeling areas for the user of said device to easily use for marking definite needed data/information regarding the relevant respective important contents in said device or corresponding sector.

19. A device as claimed in claim 13 having a plurality of visible external LED activity light indicators of different colors.

20. A device as claimed in claim 13, wherein said plurality of visible external LEDs activity light indicators are not of different colors.

21. A practical multi-purpose flash drive organizer device having external color-coded sectors of the housing adapted to enable a user to determine the contents of a sector, wherein the said color-coded sectors having at least one electrical USB connectors adapted to be plugged into a corresponding compatible computer USB interface of a host computer system, so as to enable the user of said device to display and work on certain definite desired selection or selections of data and information stored within the memory of said device, wherein said external color-coded sectors of said housing are both detachable and attachable with each other, yet having electrical contact points between said separate external sectors of said housing, so as to allow various connectivity and switchable capabilities for greater range of compatible adaptability in establishing electrical connections with various kinds of compatible electronic devices.

22. A method involving the use of a flash drive organizer device that can be optimally plugged into a variety of selected specific compatible host system; said method using said flash drive organizer having at least one USB interface connector or connectors, having external labels of "ALL CORRECT" and "NOT FINAL" on its first and second sectored halves, respectively; said method comprising of steps:
(a) the user of said flash drive organizer electrically connecting said device to a compatible host system and verifying whether or not the respective USB connector of the ALL CORRECT color-coded half-sector is really connected to the host system with the proper USB connector;
(b) double checking to see that the right color-coded half sector of said device is really connected to the host system with the right USB connector of the ALL CORRECT COLOR-CODED HALF SECTOR of said device by checking if the LED-1 light is turned on, then indicating that said device is correctly connected to the respective ALL CORRECT color-coded half sector in use;
(c) modifying and reading the desired contents of the desired chosen data file then saving the modified chosen data file;
(d) deciding whether to convert the chosen modified data file to the NOT FINAL data sector;
(e) if Yes, then deciding whether to copy the modified file in the current folder, and if deciding Yes to copy and save the modified file content into the "NOT FINAL" sector then entering the PIN or password, if required, and then the modified file is copied to the Data Buffer, then, unplugging the flash drive organizer device and connecting it to the other side and transferring the file into the "NOT FINAL" sector;
(f) if the decision is not to convert the modified data into NOT FINAL, then the modified data still remains in the "ALL CORRECT" color-coded sector;
(g) if the decision is not to make a copy of the current file, then, entering the PIN or password, if required, and the file is moved to the Data Buffer, then unplugging the flash drive organizer device and connecting it to the other side and transferring the file through the NOT Final data connector through the host system;
(h) verifying if the device is not connected with the ALL CORRECT connector by visual confirmation that the LED-2 signal activity light is turned on;
(i) selecting a data file;
(j) deciding whether to modify the selected data file;
(k) saving the selected data file;
(l) deciding whether or not to convert the modified data file to the ALL CORRECT;
(m) if the decision is NO, then end;
(n) if the decision is YES, then deciding whether to make a copy of the data file or not;
(o) if the decision is YES, then copying the file into the current folder;

(p) entering the PIN or password if required;
(q) copying the file in the DATA BUFFER;
(r) unplugging the respective flash drive organizer device connector and connecting the other side of USB connector of the corresponding other sector and transferring the file to the ALL CORRECT with the respective USB connector through the compatible linked host system, then ending the process;
(s) if, the decision is NO in making a copy of the data file, then entering the PIN or password, if required;
(t) moving the file to the DATA BUFFER;
(u) unplugging the connected respective USB connector of the flash drive and connecting the other USB connector and transferring the file to the ALL CORRECT sector, and ends.

23. A flash drive organizer device comprising of:
(a) a USB connector of the first half sector of said device capable of connecting to a host computer system (desktop computer, laptop, netbook, TV, etc); said USB connector being internally electrically linked to the Micro-Controller Unit-1, which handles the communications with the USB interface of a host computer system, wherein said Micro-Controller Unit-1 being also connected to both LED 1 labeled of the first half sector, and LED-2 of the second half sector of said device, and said USB connector as being also internally electrically linked to LED-1 which becomes lit when being used to indicate that said first half sector of said device is activated;
(b) a USB connector of the second half sector of said device being electrically linked with MCU-1 and LED-2, when connected and linked to a USB host system, the respective LED-2 is being lit to indicate that the second half sector of said device is activated and being used;
(c) RAM of said device being connected to MCU-1, and said RAM which is divided into three partitions, Partition-1, Partition-2, and Partition 3, allowing the user to select into which RAM partition each selected file data/information is to be stored for better classification, and, thus enabling the user of said device to retrieve and work on the exact file contents from the relevant selected partition where the selected file is currently located and then access and work on or display the exact desired file contents when needed, after looking for the desired file contents.

24. A programmed flash drive organizer device having a joint uni-body housing with two electrically separate color-coded first and second half sectors, wherein at the respective ends of said first and second half sectors there is a corresponding first USB connector and a second USB connector, capable of being plugged into the USB interface of a host system, and wherein said first color-coded sector contains a Micro-Controller-1 (MCU-1) which controls the communications between the host system and the ROM and the electrically linked LED-1, and wherein said second color-coded half sector contains a Micro-Controller-2 which handles the communications between the host system and said second color-coded half sector that is electrically connected to said second USB connector and a RAM and an LED-2, said device enabling the user to use the ROM with its stored application programs using a separate said first half sector, and also enabling the user to work on the stored editable data and information using the other side of the plugged second color-coded half sector, with verification that the corresponding LED-1 of said first color-coded half sector or the LED-2 of the second color-coded half sector is actively lit thus providing the user with a choice of storage, display, editing, modification and retrieval of all editable data/information organized on said second color-coded half sector and separate from the stored programs in said first color-coded half sector thus providing the user with a choice of storage to keep all editable data/information organized and separate from the stored programs.

25. A method for providing the user of a multi-purpose color-coded flash drive organizer device with recognition of which sector of said device is to be plugged in said method comprising the steps of:
(a) the user plugging the correct USB connector of said flash drive of either with the Program Data sector or the Editable Data sector into a host system;
(b) checking whether or not said device is connected with the Program sector/connector to the host system;
(c) if Yes that said device is connected to the Program Data sector/connector of said device, then,
(d) LED-1 will be turned on to indicate this correct Program sector/connector is in use, and the user may access and work with the read-only data, then ending,
(e) if said device is not connected to the Program Data sector/connector of said device, then said device is connected to the Editable Data sector/connector of said device, then LED-2 will be turned on to indicate this particular Editable sector/connector of said device is in use, and the user may the access, modify, read, or display the files from the corresponding memory of said device, then, saving the modified file or displayed data file, then, the process ends.

26. A programmed multi-purpose color-coded flash drive organizer device, comprising:
(a) a housing with differential color-coded external sectors for aiding the user of said device to rapidly delineate which sector contains the desired selected file and file contents to work on, modify, edit and display, store, exchange or transfer through the selected sector's USB connector inter-linked with a host computer system and monitor;
(b) at least one USB connector located at the end of at least one sector adapted for inter-linking with a compatible computer host system;
(c) at least one internal microprocessor located within the housing and the color-coded sector or sectors;
(d) at least one ROM containing the program files adapted for operating the said flash drive organizer;
(e) at least one RAM or partitioned memory cells adapted for storing and extracting selected rewriteable or final data and information or not-final editable data and information;
(f) at least one LED signaling activity lights adapted to indicate whether or not the selected sector is properly linked and activated for proper operations;
(g) at least one covering cap adapted to protect and expose the respective at least one selected USB connector;
(h) at least one labeling area on either/or both the external housing and/or on at least one color-coded sector and/or on the external face of the covering cap for the user to label.

27. A device as in claim 26, further comprising at least one data buffer configured for use as temporary storage and link for transferring data/information between the memory RAMs of partitioned memory cells.

* * * * *